United States Patent
Chai

(10) Patent No.: US 11,676,667 B2
(45) Date of Patent: Jun. 13, 2023

(54) MEMORY DEVICE HAVING PAGE BUFFER

(71) Applicant: SK hynix Inc., Gyeonggi-do (KR)

(72) Inventor: Soo Yeol Chai, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/372,097

(22) Filed: Jul. 9, 2021

(65) Prior Publication Data

US 2022/0230690 A1 Jul. 21, 2022

(30) Foreign Application Priority Data

Jan. 21, 2021 (KR) .......................... 10-2021-0008773

(51) Int. Cl.
*G11C 16/04* (2006.01)
*G11C 16/24* (2006.01)
*G11C 16/34* (2006.01)
*G11C 16/10* (2006.01)

(52) U.S. Cl.
CPC .......... *G11C 16/24* (2013.01); *G11C 16/0483* (2013.01); *G11C 16/10* (2013.01); *G11C 16/3459* (2013.01)

(58) Field of Classification Search
CPC ..... G11C 16/24; G11C 16/0483; G11C 16/10; G11C 16/3459; G11C 7/12; G11C 16/08
USPC .......................................... 365/185.12
See application file for complete search history.

(56) References Cited

U.S. PATENT DOCUMENTS

2013/0250698 A1* 9/2013 Kim ................ G11C 16/24
                                                    365/185.25
2014/0354260 A1* 12/2014 Kwon .............. G05F 3/08
                                                    323/313

FOREIGN PATENT DOCUMENTS

KR       10-1185552 B1      9/2012
KR    10-2017-0005917 A    1/2017

* cited by examiner

*Primary Examiner* — Tha-O H Bui
(74) *Attorney, Agent, or Firm* — IP & T Group LLP

(57) ABSTRACT

Provided herein may be a memory device having a page buffer. The memory device may include a memory cell configured to store data, and a page buffer coupled to the memory cell through a bit line and configured to store data to be used in a program operation and to precharge the bit line to a first precharge voltage or a second precharge voltage lower than the first precharge voltage depending on the data during a program verify operation performed in the program operation.

20 Claims, 19 Drawing Sheets

MEMORY DEVICE HAVING PAGE BUFFER

CROSS-REFERENCE TO RELATED APPLICATION

The present application claims priority under 35 U.S.C. § 119(a) to Korean patent application number 10-2021-0008773 filed on Jan. 21, 2021, in the Korean Intellectual Property Office, the entire disclosure of which is incorporated by reference herein.

BACKGROUND

Field of Invention

Various embodiments of the present disclosure generally relate to a memory device having a page buffer, and more particularly to a memory device having a page buffer that is capable of precharging a bit line.

Description of Related Art

A memory system may include a memory device which can store data and a controller which can control the memory device. Memory devices are classified into a volatile memory device and a nonvolatile memory device. Since the volatile memory devices have different characteristics, they have been suitably used in conformity with respective functions in electronic devices. For example, such a volatile memory device is characterized in that the speeds of a program operation and a read operation are higher than those of a nonvolatile memory device, but stored data is lost when the supply of power is interrupted. A nonvolatile memory device is characterized in that the speeds of a program operation and a read operation are lower than those of a volatile memory device, but stored data is retained even when the supply of power is interrupted. Further, because a nonvolatile memory device may have a degree of integration higher than that of a volatile memory device, the nonvolatile memory device can store a large amount of data.

A memory device may include a memory cell array which stores data, a peripheral circuit which performs a program operation, a read operation or an erase operation on memory cells included in the memory cell array, and a control logic circuit which can control the peripheral circuit.

The memory cell array may include a plurality of memory blocks, each of which may include a plurality of memory cells. The peripheral circuit may include a row decoder coupled to the plurality of memory cells through word lines and a page buffer group coupled to the plurality of memory cells through bit lines. A program voltage, a read voltage, a verify voltage or a pass voltage may be applied through the word lines, and data in the memory cells may be sensed through the bit lines.

SUMMARY

Various embodiments of the present disclosure are directed to a memory device having a page buffer that can reduce current consumption and can reduce variations in currents or voltages of the bit lines when bit lines are precharged.

One embodiment of the present disclosure provides for a memory device which includes a memory cell configured to store data, and a page buffer coupled to the memory cell through a bit line and configured to store data to be used in a program operation and to precharge the bit line to a first precharge voltage or a second precharge voltage lower than the first precharge voltage depending on the data during a program verify operation performed in the program operation.

Another embodiment of the present disclosure provides for a memory device which includes a memory cell configured to store data, and a page buffer coupled to the memory cell through a bit line and configured to apply a first precharge voltage to the bit line in response to program data and to apply a second precharge voltage lower than the first precharge voltage to the bit line in response to erase data, wherein the page buffer may include a first precharge circuit configured to output the first precharge voltage to a current sensing node in response to the program data, a second precharge circuit configured to output the second precharge voltage to the current sensing node in response to the erase data, and a bit line coupling circuit configured to transmit, to the bit line, the first or second precharge voltage, applied to the current sensing node.

Another embodiment of the present disclosure provides for a memory device which include a memory cell configured to store data, a page buffer coupled to the memory cell through a bit line and configured to precharge the bit line in response to program data or erase data, wherein the page buffer may be configured to generate a first precharge voltage for precharging the bit line through a first path in response to the program data, and generate a second precharge voltage for precharging the bit line through a second path in response to the erase data.

DETAILED DESCRIPTION

Specific structural or functional descriptions in the embodiments of the present disclosure introduced in this specification or application are exemplified to describe embodiments according to the concept of the present disclosure. The embodiments according to the concept of the present disclosure may be practiced in various forms, and the embodiments should not be construed as being limited to the embodiments described in the specification or application.

Figure 1:
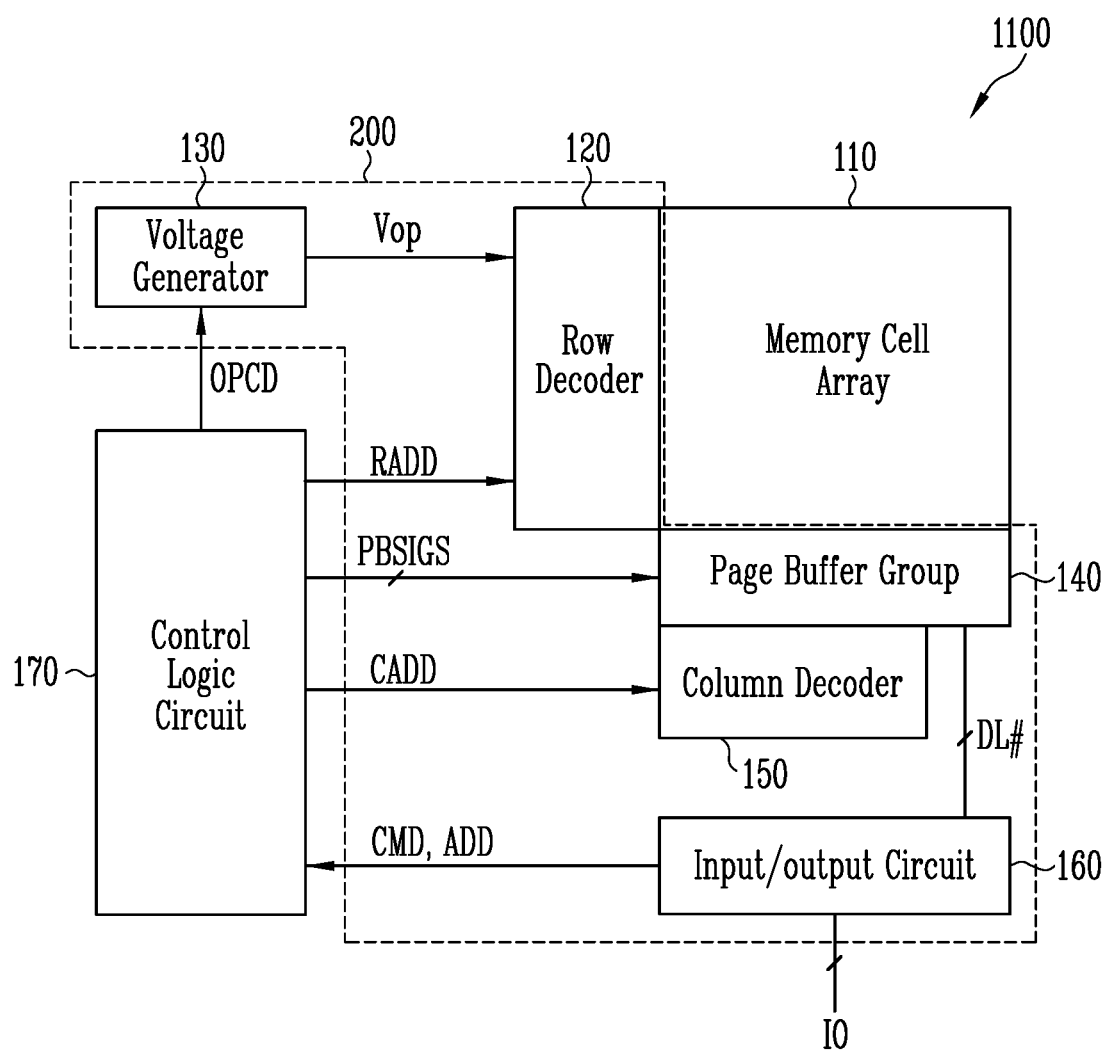
FIG. 1 is a diagram illustrating a memory device according to one embodiment of the present disclosure.

FIG. 1 is a diagram illustrating a memory device according to one embodiment.

Referring to FIG. 1, a memory device 1100 may include a memory cell array 110 which stores data, a peripheral circuit 200 which can perform program, read and erase operations, and a control logic circuit 170 which can control the peripheral circuit 200.

The memory cell array 110 may include a plurality of memory blocks in which data is stored. Each of the memory blocks may include a plurality of memory cells, which may be implemented in a two-dimensional (2D) structure in which memory cells are horizontally arranged on a substrate or in a three-dimensional (3D) structure in which memory cells are vertically stacked on a substrate.

The peripheral circuit 200 may include a row decoder 120, a voltage generator 130, a page buffer group 140, a column decoder 150, and an input/output circuit 160.

The row decoder 120 may select one memory block from the memory blocks included in the memory cell array 110 in response to a row address RADD, and the row decoder 120 may transmit operating voltages Vop to the selected memory block.

The voltage generator 130 may generate and output the operating voltages Vop for various operations in response to an operation code OPCD. For example, the voltage generator 130 may generate a program voltage, a read voltage, an erase voltage, a pass voltage, and a verify voltage in response to the operation code OPCD, and the voltage generator 130 may also generate a negative voltage. The voltage generator 130 may selectively output the generated voltages.

The page buffer group 140 may be coupled to the memory cell array 110 through bit lines. In one embodiment, the page buffer group 140 may include page buffers coupled to respective bit lines. The page buffers may be simultaneously operated in response to page buffer control signals PBSIGS, and the page buffers may temporarily store data during a program or read operation. The page buffers may sense currents or voltages of the bit lines that vary with the threshold voltages of the memory cells and store sensed data during a sensing operation. The sensing operation may be performed during a program verify operation performed in a program operation, an erase verify operation performed in an erase operation, and/or a read operation. In one embodiment, during the sensing operation, the page buffer group 140 may precharge the bit lines to a positive voltage, and the page buffer group 140 may then sense the currents or voltages of the bit lines varying with the threshold voltages of the memory cells.

The column decoder 150 may transfer data DATA between the input/output circuit 160 and the page buffer group 140 in response to a column address CADD.

The input/output circuit 160 may be coupled to an external device through input/output lines IO, and may receive/output a command CMD, an address ADD, and data DATA from/to the external device through the input/output lines IO. The external device may be a controller that is capable of controlling the memory device 1100. In one embodiment, the input/output circuit 160 may transmit the command CMD and the address ADD, received from the controller through the input/output lines IO, to the control logic circuit 170, and may transmit the data DATA, received from the controller through the input/output lines IO, to the column decoder 150. The input/output circuit 160 may output the data DATA, received from the column decoder 150, to the controller through the input/output lines IO.

The control logic circuit 170 may output the operation code OPCD, the row address RADD, the page buffer control signals PBSIGS, and the column address CADD in response to the command CMD and the address ADD. For example, the control logic circuit 170 may include software which executes an algorithm in response to the command CMD, and hardware which outputs various signals depending on the address ADD and the algorithm.

Figure 2:
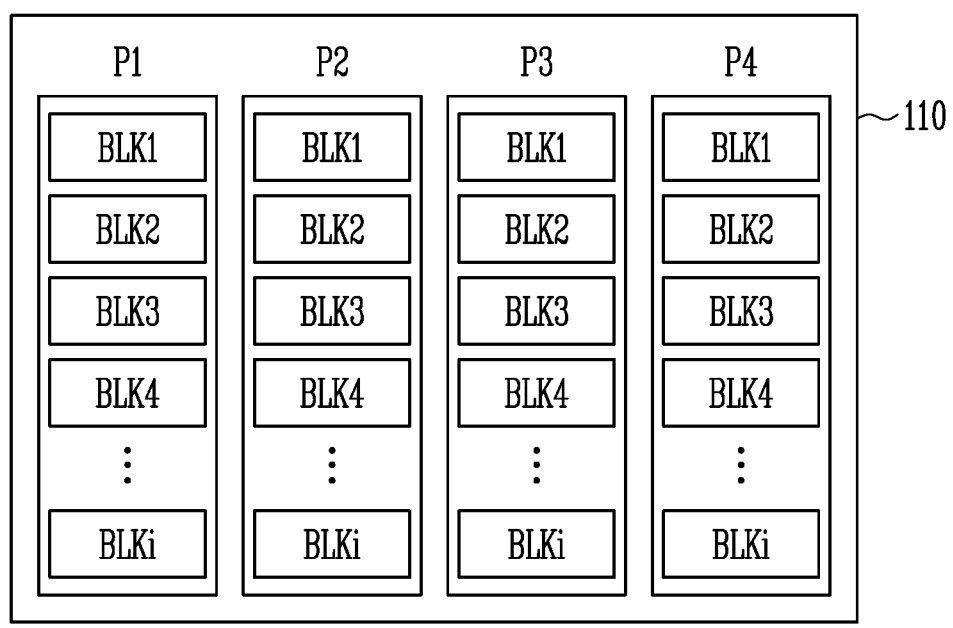
FIG. 2 is a diagram illustrating a memory cell array illustrated in FIG. 1.

FIG. 2 is a diagram illustrating the memory cell array illustrated in FIG. 1.

Referring to FIG. 2, the memory cell array 110 may be implemented as a single-plane structure or a multi-plane structure. The single-plane structure denotes a configuration in which only one plane is included in the memory cell array 110, and the multi-plane structure denotes a configuration in which multiple planes are included in the memory cell array 110. In FIG. 2, the memory cell array 110 having a multi-plane structure is illustrated. The planes may be defined as a memory area in which different row decoders are coupled to different page buffer groups. In one embodiment when first to j-th planes PL1 to PLj (where j is a positive integer) are included in the memory cell array 110, each of the first to j-th planes PL1 to PLj may include first to i-th memory blocks BLK1 to BLKi (where i is a positive integer). The first to i-th memory blocks BLK1 to BLKi included in different planes may be coupled to different row decoders and different page buffer groups, and the first to i-th memory blocks included in the same plane may be coupled to the same row decoder and the same page buffer group. The first to i-th memory blocks BLK1 to BLKi may be configured in the same structure.

Figure 3:
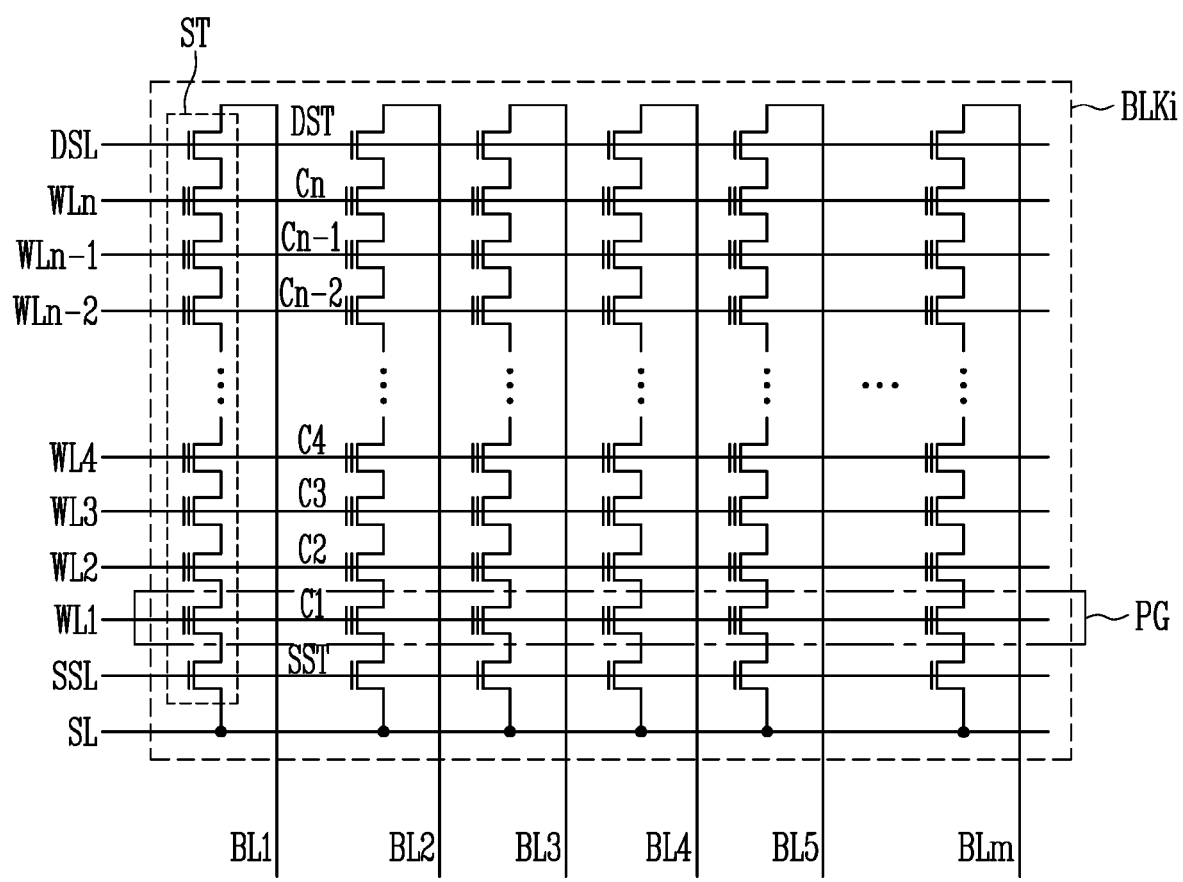
FIG. 3 is a diagram illustrating a memory block illustrated in FIG. 2.

FIG. 3 is a diagram illustrating the memory block illustrated in FIG. 2.

Referring to FIG. 3, any one memory block BLKi, of the plurality of memory blocks BLK1 to BLKi illustrated in FIG. 2, is illustrated by way of example.

The memory block BLKi may include a plurality of strings ST coupled between first to m-th bit lines BL1 to BLm (where m is a positive integer) and a source line SL. Each of the strings ST may include a source select transistor SST, first to n-th memory cells C1 to Cn, and a drain select transistor DST which are coupled in series between the source line SL and a corresponding one of the first to m-th bit lines BL1 to BLm.

Since the memory block BLKi illustrated in FIG. 3 is intended to explain the configuration of the memory block, the numbers of source select transistors SST, first to n-th memory cells C1 to Cn, and drain select transistors DST are not limited to those illustrated in FIG. 3.

Respective gates of source select transistors SST coupled to different strings ST may be coupled to a source select line SSL, respective gates of the first to n-th memory cells C1 to Cn may be coupled to first to n-th word lines WL1 to WLn, and respective gates of the drain select transistors DST may be coupled to a drain select line DSL.

A group of memory cells coupled to the same word line and included in different strings ST may form one page (PG). A program operation and a read operation may be performed on a page (PG) basis.

The memory cells included in the memory block BLKi may be programmed to different states depending on a program scheme. In one embodiment, the program operation may be performed in a single-level cell (SLC), multi-level cell (MLC), triple-level cell (TLC) or quadruple-level cell (QLC) scheme. The SLC scheme may be a scheme for storing 1 bit of data in one memory cell. The MLC scheme may be a scheme for storing 2 bits of data in one memory cell. The TLC scheme may be a scheme for storing 3 bits of data in one memory cell. The QLC scheme may be a scheme for storing 4 bits of data in one memory cell. In addition, 5 or more bits of data may be stored in one memory cell.

Figure 4:
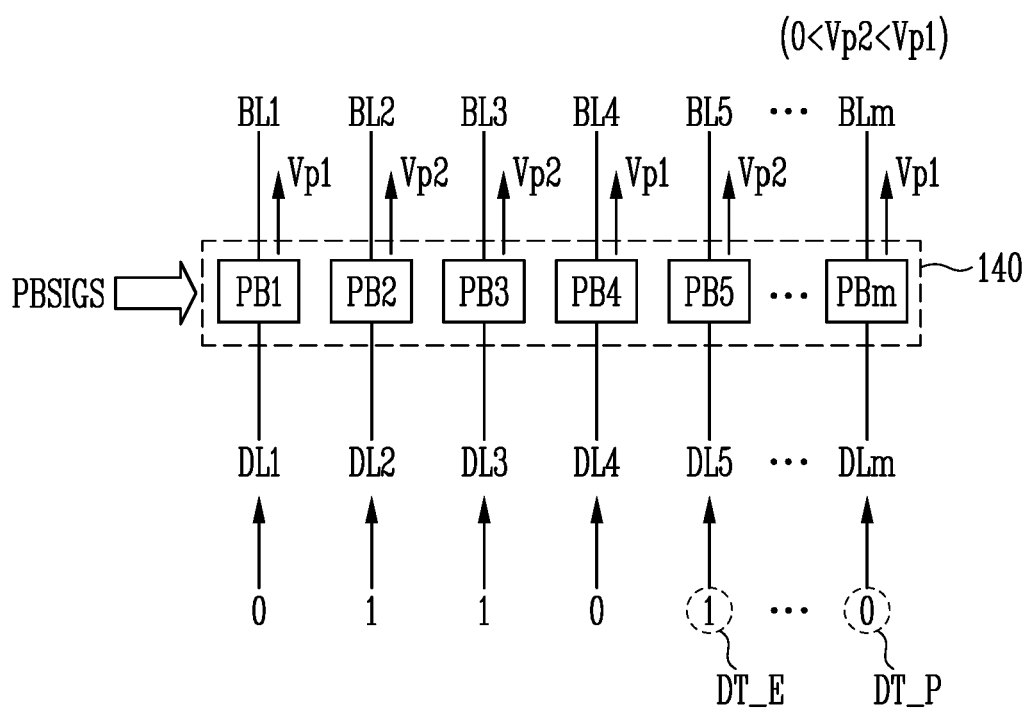
FIG. 4 is a diagram illustrating a page buffer group.

FIG. 4 is a diagram illustrating a page buffer group.

Referring to FIG. 4, the page buffer group 140 may include first to m-th page buffers PB1 to PBm. The first to m-th page buffers PB1 to PBm may be coupled between first to m-th bit lines BL1 to BLm and first to m-th data lines DL1 to DLm. During a program operation, the first to m-th page buffers PB1 to PBm may temporarily store data input through the first to m-th data lines DL1 to DLm, and the first to m-th page buffers PB1 to PBm may apply a program-permission voltage or a program-inhibition voltage to the first to m-th bit lines BL1 to BLm depending on the data. During a read operation, the first to m-th page buffers PB1 to PBm may sense currents or voltages of the bit lines BL1 to BLm and output sensed data through the first to m-th data lines DL1 to DLm.

The program operation may include the step of inputting data, received from a controller which controls the memory device, to the first to m-th page buffers PB1 to PBm, the step of setting up voltages of the first to m-th bit lines BL1 to BLm depending on the data input to the first to m-th page buffers PB1 to PBm, the step of applying a program voltage to a selected word line, and the step of verifying threshold voltages of selected memory cells coupled to the selected word line.

A program verify operation of verifying the threshold voltages of the memory cells is performed in a manner similar to that of a read operation but does not output the sensed data through the first to m-th data lines DL1 to DLm. In one embodiment, the first to m-th page buffers PB1 to PBm may decrease current consumption by the first to m-th bit lines BL1 to BLm and decrease variations in the currents or voltages of the first to m-th bit lines BL1 to BLm during the program verify operation.

The program verify operation may include the precharge step of precharging the first to m-th bit lines BL1 to BLm to a positive voltage, the step of evaluating the currents or voltages of the first to m-th bit lines BL1 to BLm which have varied with the threshold voltages of the memory cells by applying a verify voltage to the selected word line, and the step of sensing the currents or voltages of the first to m-th bit lines BL1 to BLm. At the above-described steps, in one embodiment, when a positive precharge voltage having the same level is applied to the first to m-th bit lines BL1 to BLm, i.e., all bit lines, current consumption may rapidly increase. In one embodiment, the precharge voltage may be changed depending on data input to the first to m-th page buffers PB1 to PBm or data changed due to the verify operation. In one embodiment, the first to m-th page buffers PB1 to PBm may apply a first precharge voltage Vp1 to a selected bit line and apply a second precharge voltage Vp2 lower than the first precharge voltage Vp1 to unselected bit lines in response to the page buffer control signals PBSIGS. The second precharge voltage Vp2 may be set to a positive voltage that is lower than the first precharge voltage Vp1, but is higher than 0 V.

The step of precharging the first to m-th bit lines BL1 to BLm will be described in detail below.

When the program operation is initiated, data may be input through the first to m-th data lines DL1 to DLm coupled to the first to m-th page buffers PB1 to PBm. The data input to the first to m-th page buffers PB1 to PBm may be data output from the controller which controls the memory device. The data may be composed of program data DT_P and erase data DT_E. In one embodiment, the program data DT_P may be set to '0', and the erase data DT_E may be set to '1', but at least one of the program data DT_P or the erase data DT_E may be set differently depending on the memory device or memory system.

Since the program operation is performed to increase the threshold voltages of memory cells in an erased state, a page buffer to which the program data DT_P is input may be a selected page buffer, a bit line coupled to the selected page buffer may be a selected bit line, and a memory cell coupled to the selected bit line and a selected word line may be a selected memory cell. A page buffer to which the erase data DT_E is input may be an unselected page buffer, a bit line coupled to the unselected page buffer may be an unselected bit line, and a memory cell coupled to the unselected bit line and the selected word line may be an unselected memory cell.

After a program voltage has been applied to the selected word line for a predetermined period of time since the initiation of the program operation, the program verify operation may be performed. When the program verify operation is initiated, page buffers to which the program data DT_P is input, of the first to m-th page buffers PB1 to PBm, apply the first precharge voltage Vp1 to the bit lines, and page buffers to which the erase data DT_E is input may apply the second precharge voltage Vp2 to the bit lines.

Assuming that the step (or phase) of applying the program voltage and the program verify step (phase) form one program loop, a plurality of program loops may be performed until the threshold voltages of the selected memory cells increase up to target voltages. Whenever each program loop is performed, the program voltage may be increased by a step voltage. This scheme of increasing the step voltage is referred to herein as incremental step pulse programming (ISPP) scheme. Since threshold voltages of the selected memory cells are increased through the program voltage while the ISPP scheme is performed, program data DT_P that is stored in the page buffers corresponding to memory cells having passed the program verify operation may be changed to erase data DT_E so as to be prevented from being over-programmed.

In one embodiment, as the number of program loops increases during the program operation, the number of page buffers having erase data DT_E increases, and thus the number of bit lines to which the second precharge voltage Vp2 is applied also increases during the program verify operation.

Each page buffer configured to apply the first or second precharge voltage Vp1 or Vp2 to a bit line depending on data will be described in detail below.

Figure 5:
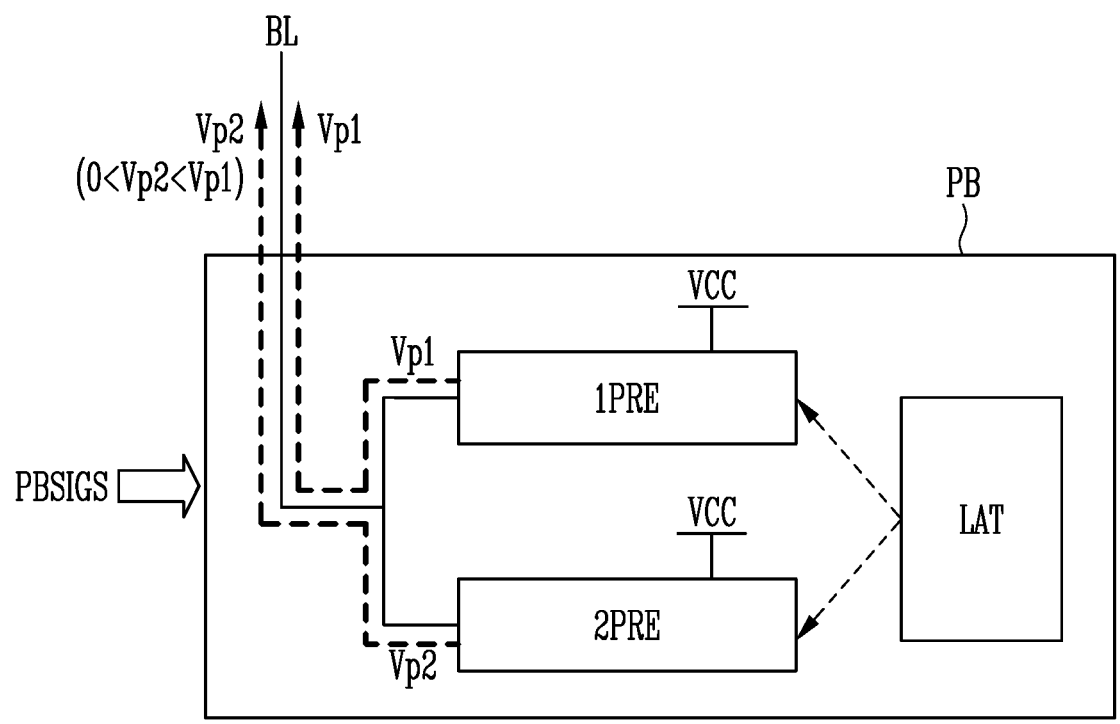
FIG. 5 is a diagram illustrating a page buffer according to one embodiment.

FIG. 5 is a diagram illustrating a page buffer according to one embodiment.

Referring to FIG. 5, first to m-th page buffers (e.g., PB1 to PBm of FIG. 4) are configured in the same manner, and thus any one of the page buffers is illustrated in FIG. 5 as an example.

In one embodiment, the page buffer PB may include at least one latch LAT configured to store data, and may selectively activate a first precharge circuit 1PRE which can output a first precharge voltage Vp1, or a second precharge circuit 2PRE which can output a second precharge voltage Vp2, depending on the data stored in the latch LAT. The first and second precharge voltages Vp1 and Vp2 may be set to positive voltages higher than 0 V, and the second precharge voltage Vp2 may be set to a value lower than the first precharge voltage Vp1. The first to m-th page buffers (e.g., PB1 to PBm of FIG. 4) may be simultaneously operated in response to page buffer control signals PBSIGS, but the first to m-th page buffers may selectively activate the first or second precharge circuit 1PRE or 2PRE depending on the stored data. In one embodiment, when program data is stored in the latch LAT, the page buffer PB may activate the first precharge circuit 1PRE and then apply the first precharge voltage Vp1 to a bit line BL. In one embodiment, when the first precharge circuit 1PRE is activated, the second precharge circuit 2PRE may be deactivated. In one embodiment, when erase data is stored in the latch LAT, the page buffer PB may activate the second precharge circuit 2PRE and then apply the second precharge voltage Vp2 to the bit line BL.

The first and second precharge circuits 1PRE and 2PRE may be supplied in common with a supply voltage VCC, but may generate the first and second precharge voltages Vp1 and Vp2 having different voltage levels through different paths depending on the data stored in the latch LAT.

The page buffer PB including the first and second precharge circuits 1PRE and 2PRE may be configured in various forms. The page buffer PB which may output the first and second precharge voltages Vp1 and Vp2 having different voltage levels through different paths will be described in detail below.

Figure 6:
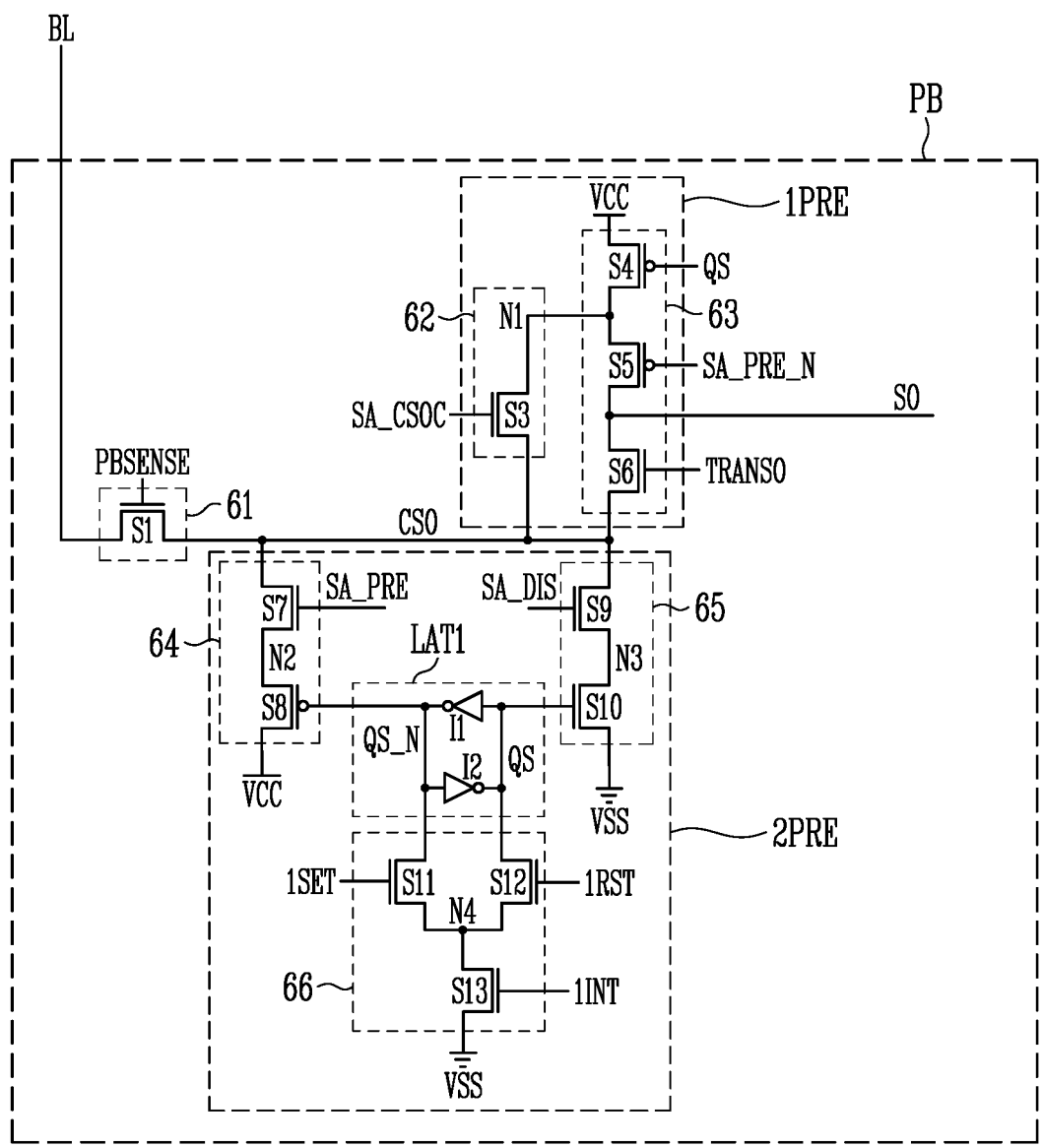
FIG. 6 is a circuit diagram illustrating a page buffer according to a first embodiment.

FIG. 6 is a circuit diagram illustrating a page buffer according to a first embodiment.

Referring to FIG. 6, the page buffer PB may include a bit line coupling circuit 61, a first precharge circuit 1PRE, and a second precharge circuit 2PRE. The bit line coupling circuit 61, the first precharge circuit 1PRE, and the second precharge circuit 2PRE may be coupled in common to a current sensing node CSO. For example, the bit line coupling circuit 61 may be coupled between the current sensing node CSO and the bit line BL. A supply voltage VCC may be supplied to the first precharge circuit 1PRE. Both the supply voltage VCC and a ground voltage VSS may be supplied to the second precharge circuit 2PRE.

The bit line coupling circuit 61 may include a first switch S1 which can be turned on in response to a page buffer sensing signal PBSENSE. The first switch S1 may be implemented as an NMOS transistor. In one embodiment, when the bit line is precharged, the page buffer sensing signal PBSENSE having a high level may be applied to the first switch S1.

The first precharge circuit 1PRE may include an unselect precharge circuit 62 and a sensing circuit 63.

The unselect precharge circuit 62 may apply a constant positive voltage to the bit line BL regardless of data. The unselect precharge circuit 62 may include a third switch S3 coupled between a first node N1 and the current sensing node CSO. The third switch S3 may be implemented as an NMOS transistor which is turned on or off in response to a current sensing signal SA_CSOC. During a precharge operation, the third switch S3 may be turned on in response to the current sensing signal SA_CSOC having a high level.

The sensing circuit 63 may be coupled to the unselect precharge circuit 62 through the first node N1, and the sensing circuit 63 may be electrically coupled to or decoupled from the unselect precharge circuit 62 depending on data input to a data node QS. The sensing circuit 63 may include fourth to sixth switches S4 to S6 coupled in series between a terminal supplied with the supply voltage VCC and the current sensing node CSO. The fourth switch S4 may be implemented as a PMOS transistor which is turned on or off depending on the data input to the data node QS. The fifth switch S5 may be implemented as a PMOS transistor which is turned on or off in response to an inverted precharge signal SA_PRE_N. The first node N1 may be coupled between the fourth and fifth switches S4 and S5. The sixth switch S6 may be coupled between the fifth switch S5 and the current sensing node CSO, and the sixth switch S6 may be implemented as an NMOS transistor which is turned on or off in response to a transmission signal TRANSO. A sensing node SO may be coupled between the fifth and sixth switches S5 and S6. In one embodiment, a plurality of latches may be coupled to the sensing node SO.

The second precharge circuit 2PRE may include a select precharge circuit 64, a discharge circuit 65, a first latch LAT1 and a first initialization circuit 66.

The select precharge circuit 64 may include seventh and eighth switches S7 and S8 coupled between the terminal supplied with the supply voltage VCC and the current sensing node CSO. The seventh switch S7 may be coupled between the current sensing node CSO and a second node N2, and the seventh switch S7 may be implemented as an NMOS transistor which is turned on or off in response to a precharge signal SA_PRE. The eighth switch S8 may be coupled between the terminal supplied with the supply voltage VCC and the second node N2, and may be implemented as a PMOS transistor which is turned on or off in response to data input to an inverting data node QS_N.

The discharge circuit 65 may include ninth and tenth switches S9 and S10 coupled in series between the terminal supplied with the ground voltage VSS and the current sensing node CSO. The ninth switch S9 may be coupled between the current sensing node CSO and a third node N3, and may be implemented as an NMOS transistor which is turned on or off in response to a discharge signal SA_DIS. The tenth switch S10 may be coupled between the terminal supplied with the ground voltage VSS and the third node N3, and the tenth switch S10 may be implemented as an NMOS transistor which is turned on or off in response to the data input to the data node QS.

The first latch LAT1 may be a latch used in a program verify operation, and the first latch LAT1 may correspond to the latch LAT illustrated in FIG. 5. For example, the first latch LAT1 may include first and second inverters I1 and I2 coupled in parallel between the data node QS and the inverting data node QS_N. For example, the sensed data may be input to the data node QS, and the data node QS may be coupled to an input terminal of the first inverter I1. An output terminal of the first inverter I1 may be coupled to the inverting data node QS_N. The inverting data node QS_N may be coupled to an input terminal of the second inverter I2, and the data node QS may be coupled to an output terminal of the second inverter I2. Therefore, pieces of data which are inverted to each other may be input to the data node QS and to the inverting data node QS_N.

The first initialization circuit 66 may be coupled between the terminal supplied with the ground voltage VSS and the first latch LAT1. In one embodiment, the first initialization circuit 66 may include an eleventh switch S11 coupled between the inverting data node QS_N and a fourth node N4, a twelfth switch S12 coupled between the data node QS and the fourth node N4, and a thirteenth switch S13 coupled between the terminal supplied with the ground voltage VSS and the fourth node N4. The eleventh switch S11 may be implemented as an NMOS transistor which is turned on or off in response to a first setup signal 1SET. The twelfth switch S12 may be implemented as an NMOS transistor which is turned on or off in response to a first reset signal 1RST. The thirteenth switch S13 may be implemented as an NMOS transistor which is turned on or off in response to a first initialization signal 1INT.

A precharge operation using the above-described page buffer PB according to the first embodiment will be described below.

Figure 7A:
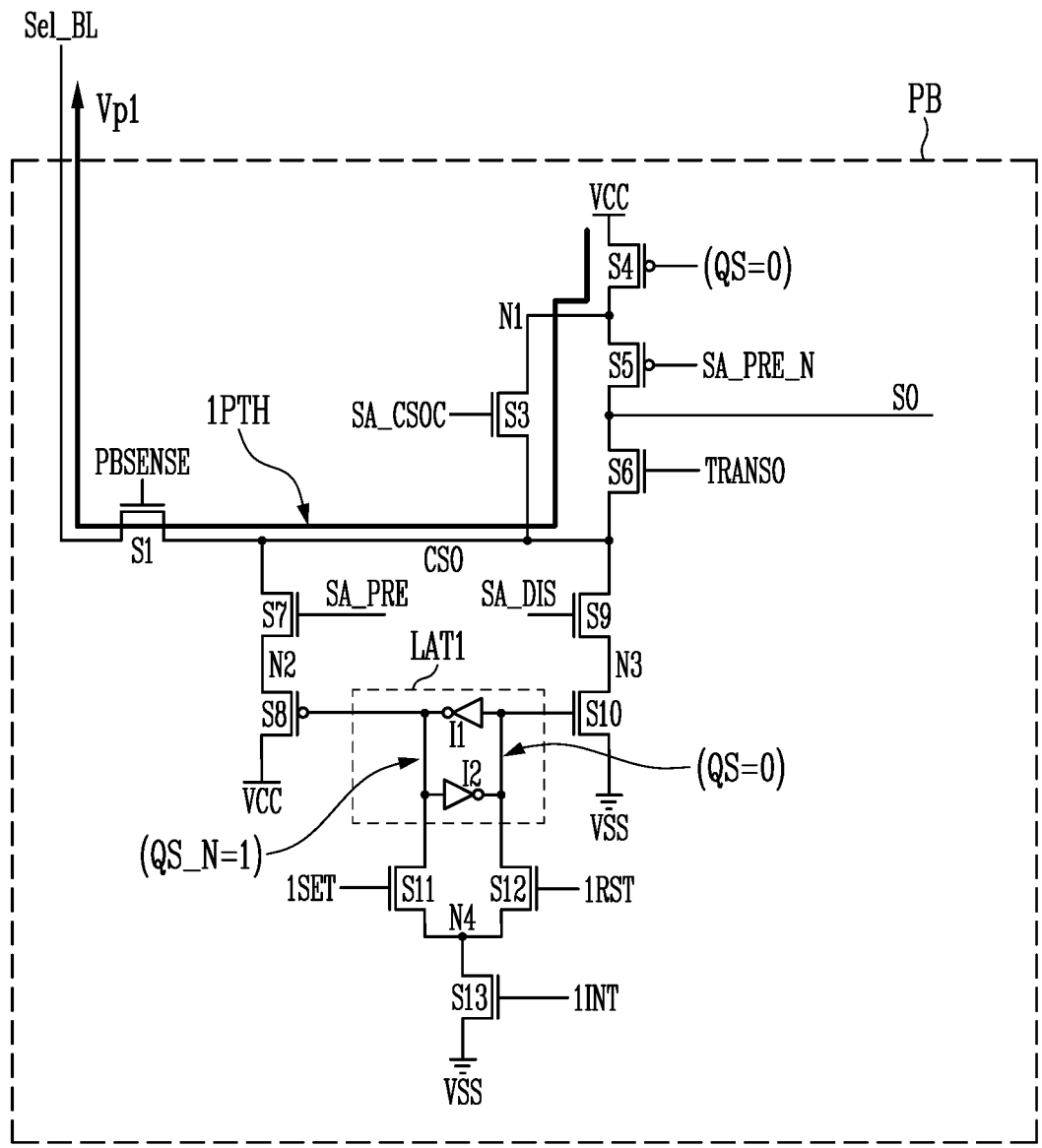
FIGS. 7A and 7B are diagrams illustrating a precharge operation using the page buffer according to the first embodiment.
Figure 7B:
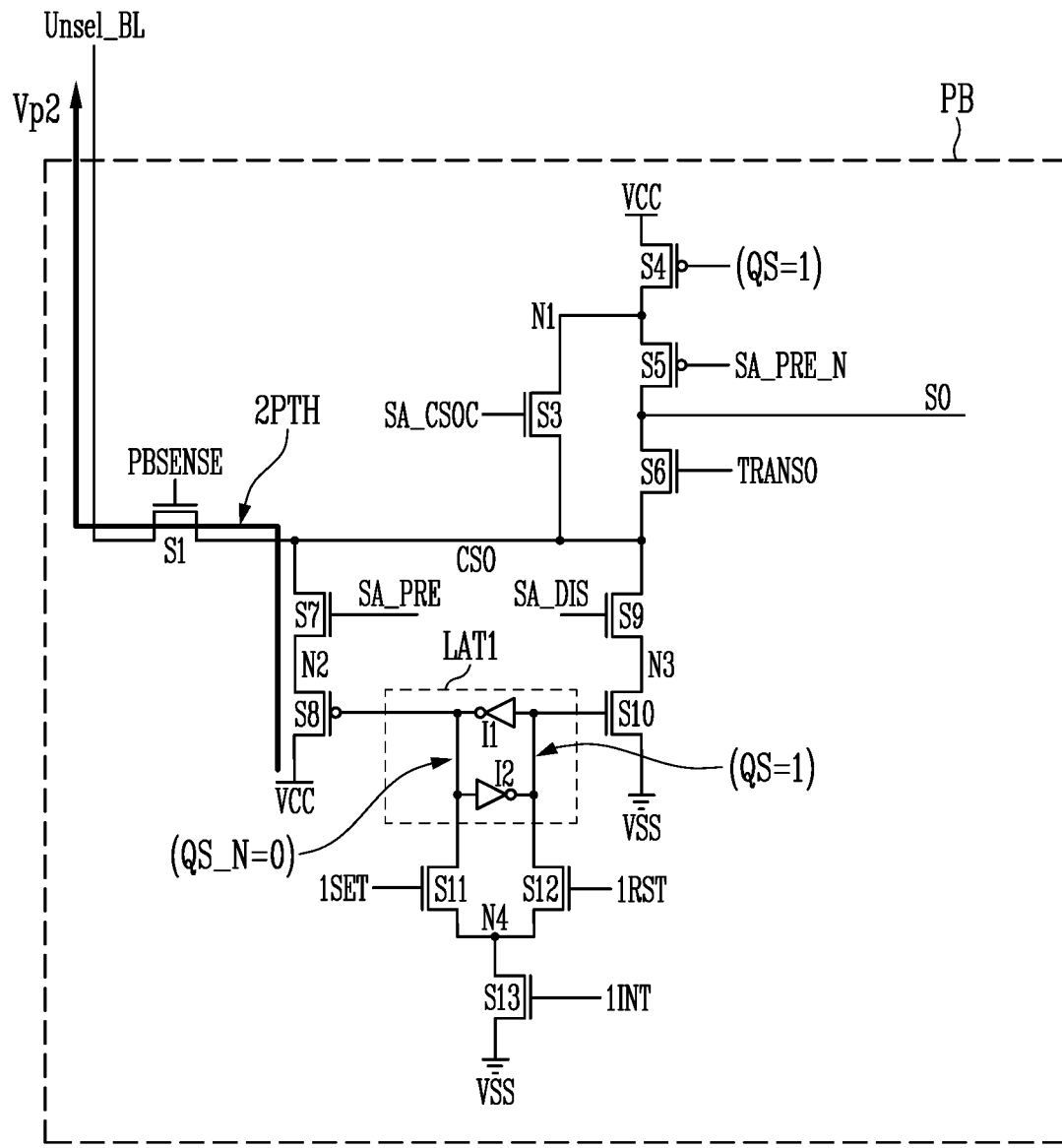

FIGS. 7A and 7B are diagrams illustrating the precharge operation using the page buffer according to the first embodiment. FIG. 7A is a diagram illustrating a precharge operation of the page buffer PB coupled to a selected bit line Sel_BL, and FIG. 7B is a diagram illustrating a precharge operation of the page buffer PB coupled to an unselected bit line Unsel_BL.

Referring to FIG. 7A, the selected bit line Sel_BL denotes a bit line coupled to a selected memory cell, and the selected memory cell denotes a memory cell, a threshold voltage of which is to be increased during a program operation. The selected memory cell and the unselected memory cell may be distinguished from each other based on data input to the data node QS of the first latch LAT1. In one embodiment, it is assumed that program data corresponding to the selected memory cell is '0' and erase data corresponding to the unselected memory cell is '1'. Data '0' may be identified as a voltage having a low level, and data '1' may be identified as a voltage having a high level.

During a precharge operation, the page buffer sensing signal PBSENSE, the precharge signal SA_PRE, the current sensing signal SA_CSOC, and the transmission signal TRANSO, which have a high level, may be applied to the page buffer PB. In one embodiment, voltages of some signals may be set to different values. In one embodiment, the voltage level of the current sensing signal SA_CSOC may be set to a value lower than that of the transmission signal TRANSO, the voltage level of the page buffer sensing signal PBSENSE may be set to a value lower than that of the current sensing signal SA_CSOC, and the voltage level of the precharge signal SA_PRE may be set to a value lower than or equal to that of the page buffer sensing signal PBSENSE.

When data input to the data node QS is '0', data '1' is input to the inverting data node QS_N, and thus the eighth switch S8 is turned off. Therefore, even if the precharge signal SA_PRE having a high level is applied and the seventh switch S7 is turned on, the second node N2 is not coupled to the current sensing node CSO.

Since data input to the data node QS is '0', and both the current sensing signal SA_CSOC and the page buffer sensing signal PBSENSE have a high level, the fourth, third, and first switches S4, S3, and S1 are turned on, and thus a first path 1PTH may be formed. The first precharge voltage Vp1 is generated from the supply voltage VCC supplied to the fourth switch S4 while passing through the first path 1PTH, the selected bit line Sel_BL may be precharged to the first precharge voltage Vp1. That is, the page buffers, in which data '0' is input to the data node QS of the first latch LAT1, may precharge bit lines to the first precharge voltage Vp1.

Referring to FIG. 7B, the unselected bit line Unsel_BL denotes a bit line coupled to an unselected memory cell, and the unselected memory cell denotes a memory cell, a threshold voltage of which is not to be increased during a program operation. The selected memory cell and the unselected memory cell may be distinguished from each other based on data input to the data node QS of the first latch LAT1. In one embodiment, it is assumed that data corresponding to the selected memory cell is '0' and data corresponding to the unselected memory cell is '1'. Data '0' may be identified as a voltage having a low level, and data '1' may be identified as a voltage having a high level.

When data input to the data node QS is '1', data '0' is input to the inverting data node QS_N, and thus the eighth switch S8 may be turned on. Since the page buffer sensing signal PBSENSE and the precharge signal SA_PRE have a high level, the seventh and first switches S7 and S1 may be turned on to form a second path 2PTH. Therefore, the second precharge voltage Vp2 may be generated from the supply voltage VCC supplied to the eighth switch S8 while passing through the second path 2PTH, and the second precharge voltage Vp2 may be applied to the unselected bit line Unsel_BL. That is, the page buffers, in which data '1' is input to the data node QS of the first latch LAT1, may apply the second precharge voltage Vp2 to the bit lines.

In one embodiment, because the voltage level of the precharge signal SA_PRE for turning on the seventh switch S7 included in the second path 2PTH is set to a value lower than the voltage levels of signals for turning on the switches included in the first path (e.g., 1PTH of FIG. 7A), the turn-on level of the seventh switch S7 is at a lower voltage level than the turn-on level of the switches included in the first path 1PTH. Therefore, the second precharge voltage Vp2 lower than the first precharge voltage Vp1 may be applied to the current sensing node CSO, and the first switch S1 may be turned on, and thus the unselected bit line Unsel_BL may be precharged to the second precharge voltage Vp2. That is, the page buffers, in which data '1' is input to the data node QS of the first latch LAT1, may precharge the bit lines to the second precharge voltage Vp2 which is lower than the first precharge voltage (e.g., Vp1 of FIG. 7A). Since the second precharge voltage Vp2 output through the second path 2PTH is lower than the first precharge voltage Vp1, current consumption may be lower than that when all bit lines are precharged to the first precharge voltage Vp1.

Figure 8:
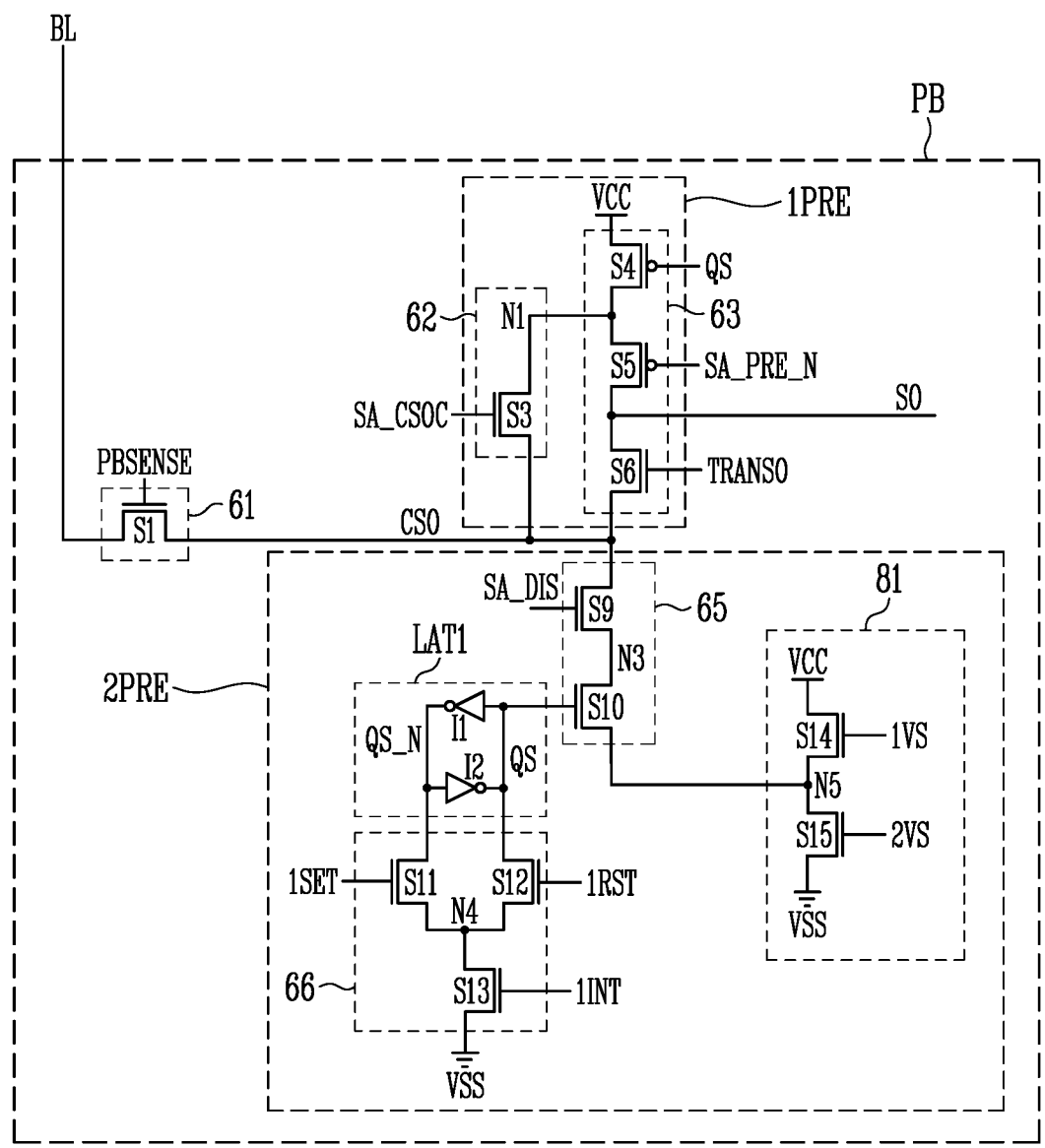
FIG. 8 is a circuit diagram illustrating a page buffer according to a second embodiment.

FIG. 8 is a circuit diagram illustrating a page buffer according to a second embodiment.

Referring to FIG. 8, some components of the page buffer PB according to the second embodiment are similar to those of the page buffer PB according to the first embodiment, and thus a repeated description of components overlapping the first embodiment will be omitted.

In the page buffer PB according to the second embodiment, the select precharge circuit (e.g., 64 of FIG. 6) according to the first embodiment is omitted, and a power selection circuit 81 for selectively supplying a supply voltage VCC or a ground voltage VSS may be included in a discharge circuit 65.

The power selection circuit 81 may be coupled to the tenth switch S10 of the discharge circuit 65. The power selection circuit 81 may include fourteenth and fifteenth switches S14 and S15 coupled in series between a terminal supplied with the supply voltage VCC and a terminal supplied with the ground voltage VSS. The fourteenth switch S14 may be coupled between the terminal supplied with the supply voltage VCC and a fifth node N5, and the fourteenth switch S14 may be implemented as an NMOS transistor which is turned on or off in response to a first power selection signal 1VS. The fifteenth switch S15 may be coupled between the terminal supplied with the ground voltage VSS and the fifth node N5, and the fifteenth switch S15 may be implemented as an NMOS transistor which is turned on or off in response to a second power selection signal 2VS. In one embodiment, while a precharge operation is performed, the second power selection signal 2VS may have a low level, and the first power selection signal 1VS may have a high level. In one embodiment, when a precharge operation is not performed, the first power selection signal 1VS may have a low level, and the second power selection signal 2VS may have a high level.

Figure 9A:
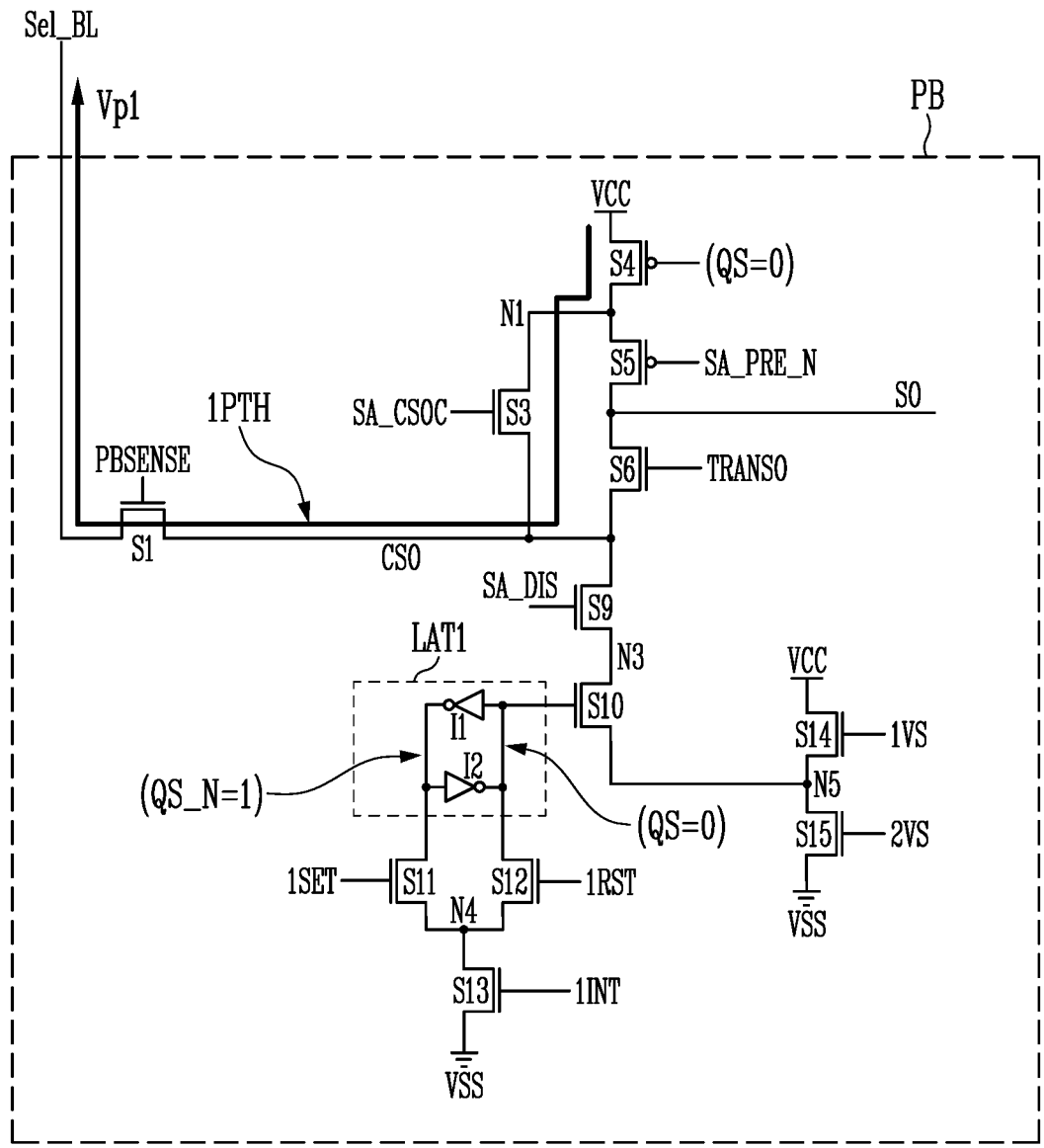
FIGS. 9A and 9B are diagrams illustrating a precharge operation using the page buffer according to the second embodiment.
Figure 9B:
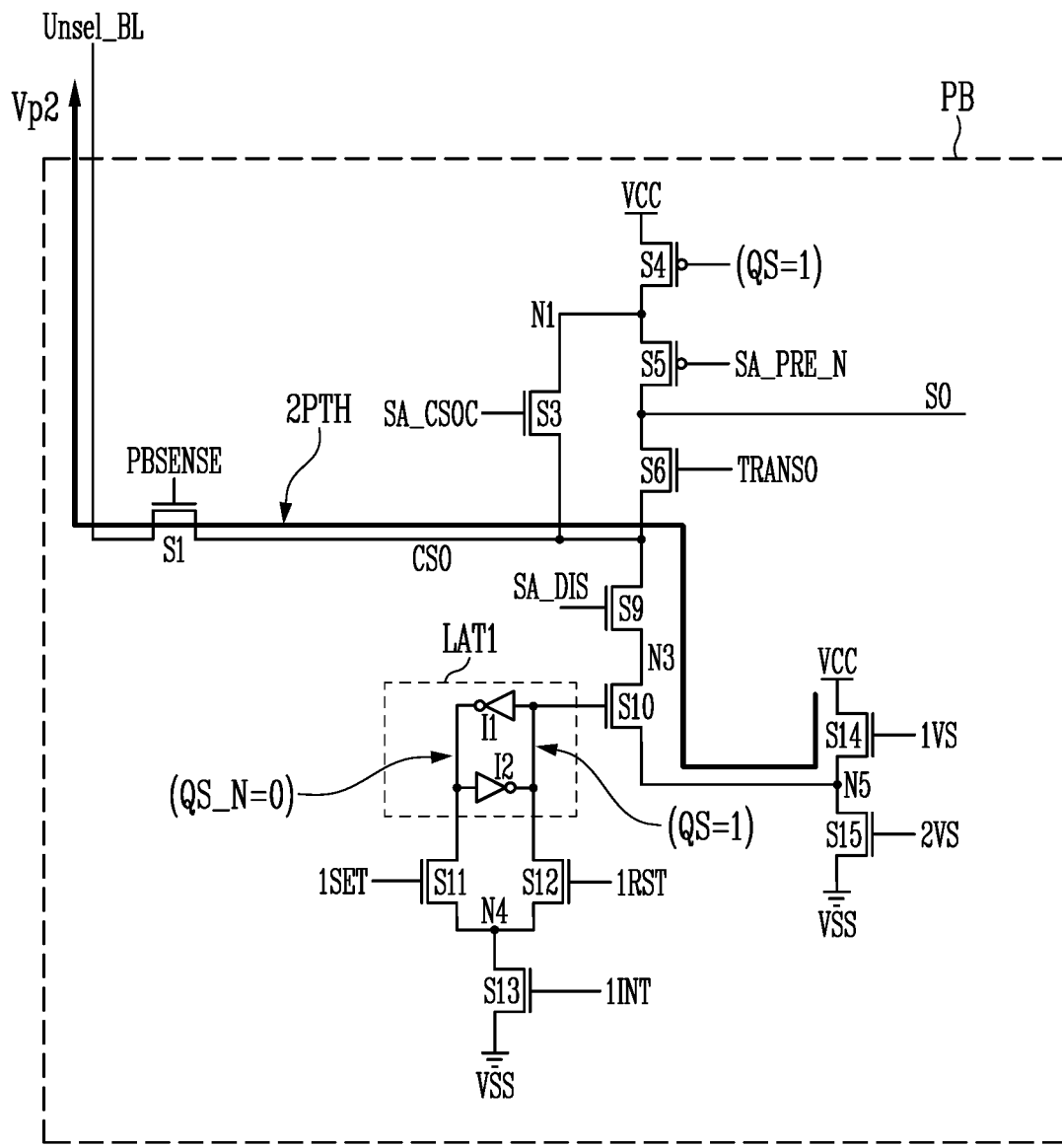

FIGS. 9A and 9B are diagrams illustrating the precharge operation using the page buffer according to the second embodiment, FIG. 9A is a diagram illustrating a precharge operation of the page buffer PB coupled to a selected bit line Sel_BL, and FIG. 9B is a diagram illustrating a precharge operation of the page buffer PB coupled to an unselected bit line Unsel_BL.

Referring to FIG. 9A, during a precharge operation, a page buffer sensing signal PBSENSE, a precharge signal SA_PRE, a current sensing signal SA_CSOC, a transmission signal TRANSO, and a discharge signal SA_DIS, which have a high level, may be applied to the page buffer PB. In one embodiment, voltages of some signals may be set to different values. In one embodiment, the voltage level of the current sensing signal SA_CSOC may be set to a value lower than that of the transmission signal TRANSO, the voltage level of the page buffer sensing signal PBSENSE may be set to a value lower than that of the current sensing signal SA_CSOC, and the voltage level of the discharge signal SA_DIS may be set to a value lower than or equal to that of the page buffer sensing signal PBSENSE.

When data input to the data node QS is '0', the page buffer PB may output the first precharge voltage Vp1 through a first path 1PTH. Since the first path 1PTH through which the first precharge voltage Vp1 is output is identical to that of the first embodiment, a repeated description thereof will be omitted.

Referring to FIG. 9B, since data input to the data node QS is '1', and both the discharge signal SA_DIS and the first power selection signal 1VS have a high level, the fourteenth, tenth, ninth, and first switches S14, S10, S9, and S1 may be turned on, and thus a second path 2PTH may be formed. Therefore, the second precharge voltage Vp2 may be generated from the supply voltage VCC supplied to the fourteenth switch S14 while passing through the second path 2PTH, and the second precharge voltage Vp2 may be applied to the unselected bit line Unsel_BL. That is, the page buffers, in which data '1' is input to the data node QS of the first latch LAT1, may apply the second precharge voltage Vp2 to the bit lines.

In one embodiment, since the voltage level of the discharge signal SA_DIS for turning on the ninth switch S9 included in the second path 2PTH is set to a value lower than the voltage levels of signals for turning on the switches included in the first path (e.g., 1PTH of FIG. 9A), the turn-on level of the ninth switch S9 is at a lower voltage level than the turn-on level of the switches included in the first path 1PTH. Therefore, the second precharge voltage Vp2 lower than the first precharge voltage Vp1 may be applied to the current sensing node CSO, and the first switch S1 may be turned on, and thus the unselected bit line Unsel_BL may be precharged to the second precharge voltage Vp2. That is, the page buffers, in which data '1' is input to the data node QS of the first latch LAT1, may precharge the bit lines to the second precharge voltage Vp2 lower than the first precharge voltage (e.g., Vp1 of FIG. 9A). Since the second precharge voltage Vp2 output through the second path 2PTH is lower than the first precharge voltage Vp1, current consumption may be lower than that when all bit lines are precharged to the first precharge voltage Vp1.

Figure 10:
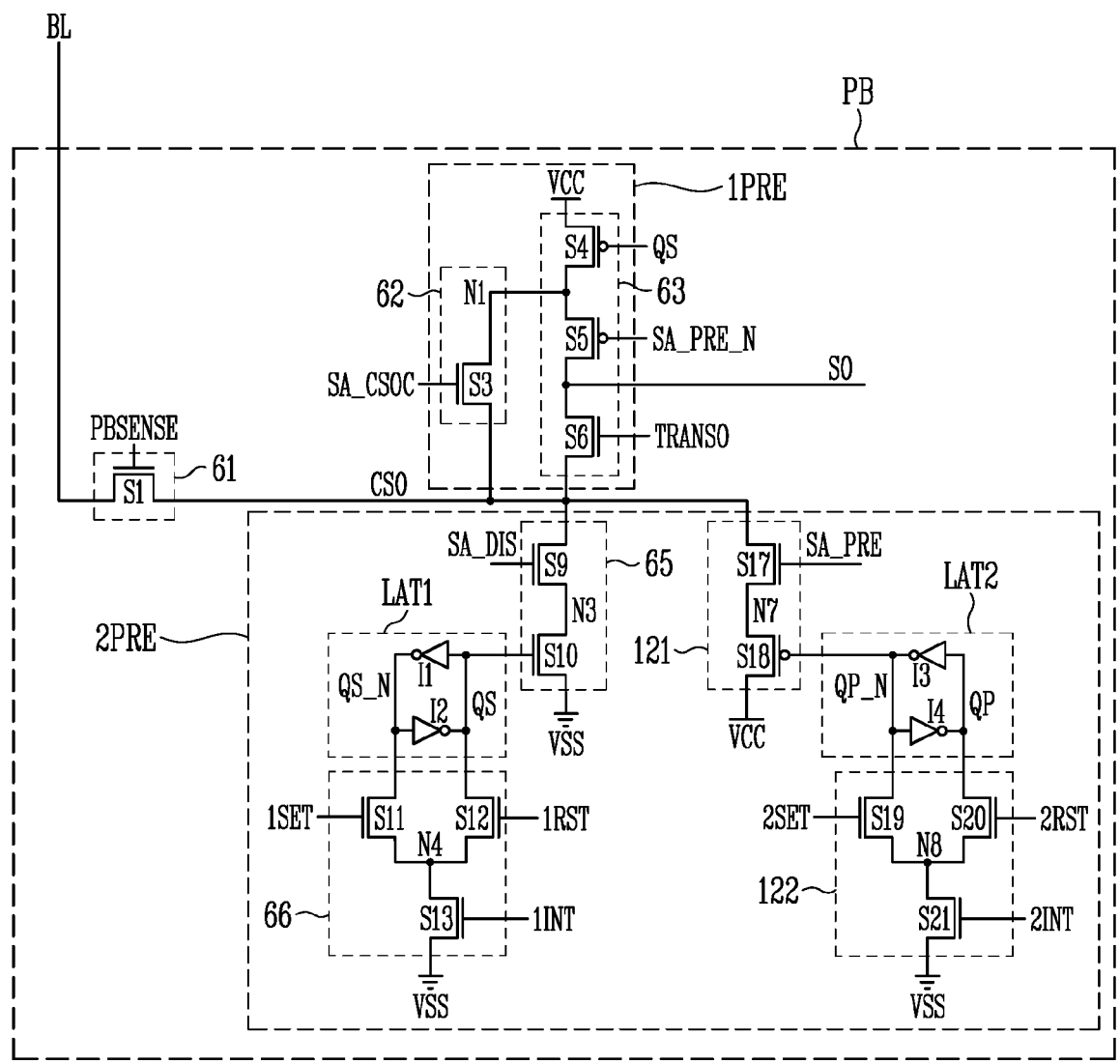
FIG. 10 is a circuit diagram illustrating a page buffer according to a third embodiment.

FIG. 10 is a circuit diagram illustrating a page buffer according to a third embodiment.

Referring to FIG. 10, some components of the page buffer PB according to the third embodiment are similar to those of the page buffer PB according to the second embodiment, and thus a repeated description of components overlapping the second embodiment will be omitted.

In the page buffer PB according to the third embodiment, the power selection circuit 81 according to the second embodiment is omitted, and a second sub-precharge circuit 121, a second latch LAT2, and a second initialization circuit 122 may be included.

The second sub-precharge circuit 121 may be coupled between a terminal supplied with a supply voltage VCC and a current sensing node CSO, the second latch LAT2 may be coupled between the second sub-precharge circuit 121 and the second initialization circuit 122, and the second initialization circuit 122 may be coupled between a terminal supplied with a ground voltage VSS and the second latch LAT2.

The second sub-precharge circuit 121 may include seventeenth and eighteenth switches S17 and S18 coupled in series between the terminal supplied with the supply voltage VCC and the current sensing node CSO. The seventeenth switch S17 may be coupled between the current sensing node CSO and a seventh node N7, and the seventeenth switch S17 may be implemented as an NMOS transistor which is turned on or off in response to a precharge signal SA_PRE. The eighteenth switch S18 may be coupled between the terminal supplied with the supply voltage VCC and the seventh node N7, and the eighteenth switch S18 may be implemented as a PMOS transistor which is turned on or off in response to data input to an inverting data replica node QP_N of the second latch LAT2.

The second latch LAT2 may be configured to store the same data as the first latch LAT1. In one embodiment, the second latch LAT2 may store data replicated from data stored in the first latch LAT1. The second latch LAT2 may include third and fourth inverters 13 and 14 coupled in parallel between a data replica node QP and the inverting data replica node QP_N. An output terminal of the third inverter 13 may be coupled to the inverting data replica node QP_N, and the inverting data replica node QP_N may be coupled to a gate of the eighteenth switch S18. An input terminal of the fourth inverter 14 may be coupled to the output terminal of the third inverter 13, and an output terminal of the fourth inverter 14 may be coupled to the input terminal of the third inverter 13.

The second initialization circuit 122 may be coupled between the terminal supplied with the ground voltage VSS and the second latch LAT2. In one embodiment, the second initialization circuit 122 may include a nineteenth switch S19 coupled between the inverting data replica node QP_N and an eighth node N8, a twentieth switch S20 coupled between the data replica node QP and the eighth node N8, and a 21-st switch S21 coupled between the terminal supplied with the ground voltage VSS and the eighth node N8. The nineteenth switch S19 may be implemented as an NMOS transistor which is turned on or off in response to a second setup signal 2SET. The twentieth switch S20 may be implemented as an NMOS transistor which is turned on or off in response to a second reset signal 2RST. The 21-st switch S21 may be implemented as an NMOS transistor which is turned on or off in response to a second initialization signal 2INT.

A precharge operation using the above-described page buffer PB according to the third embodiment will be described below.

Figure 11A:
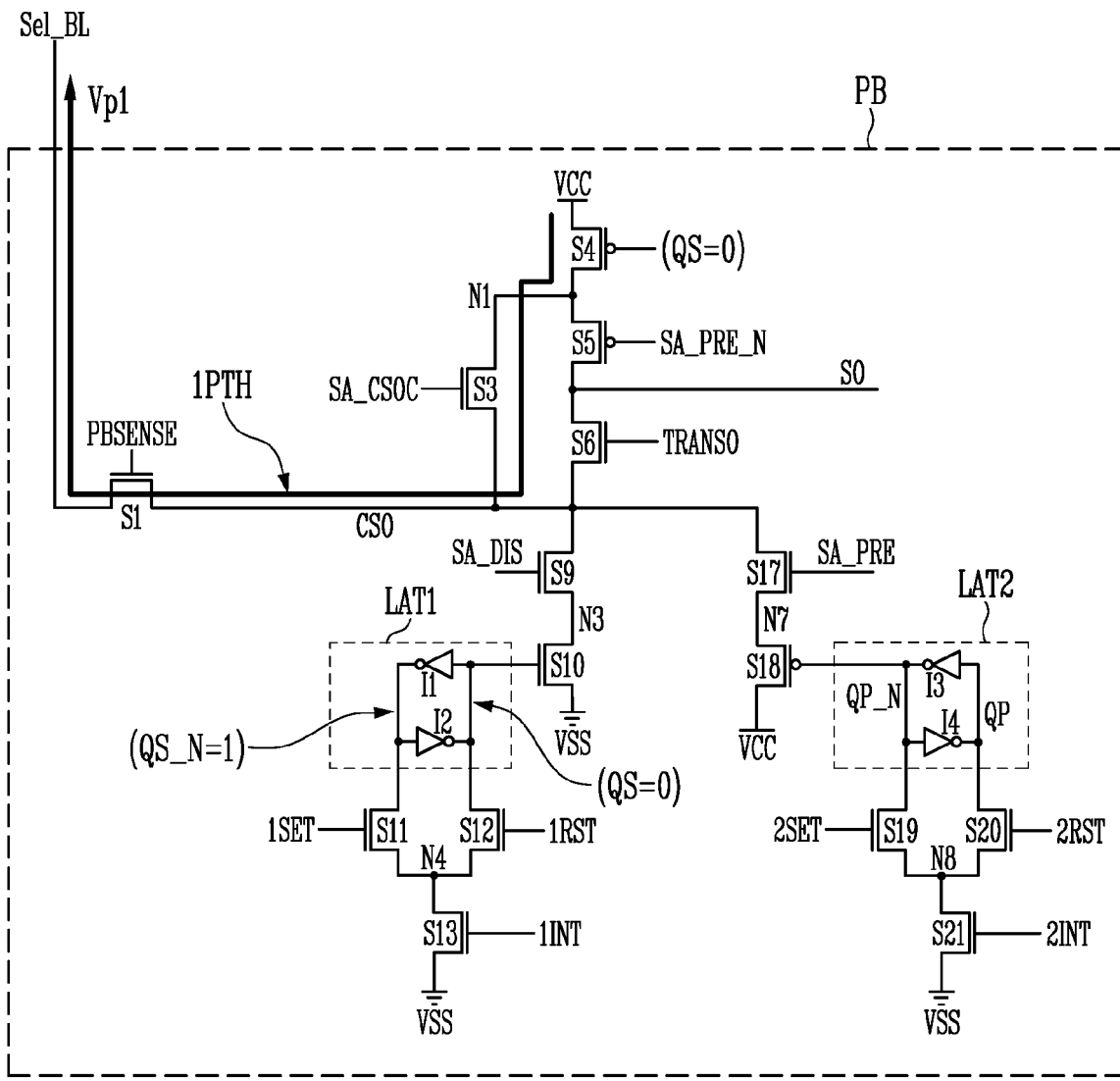
FIGS. 11A and 11B are diagrams illustrating a precharge operation using the page buffer according to the third embodiment.
Figure 11B:
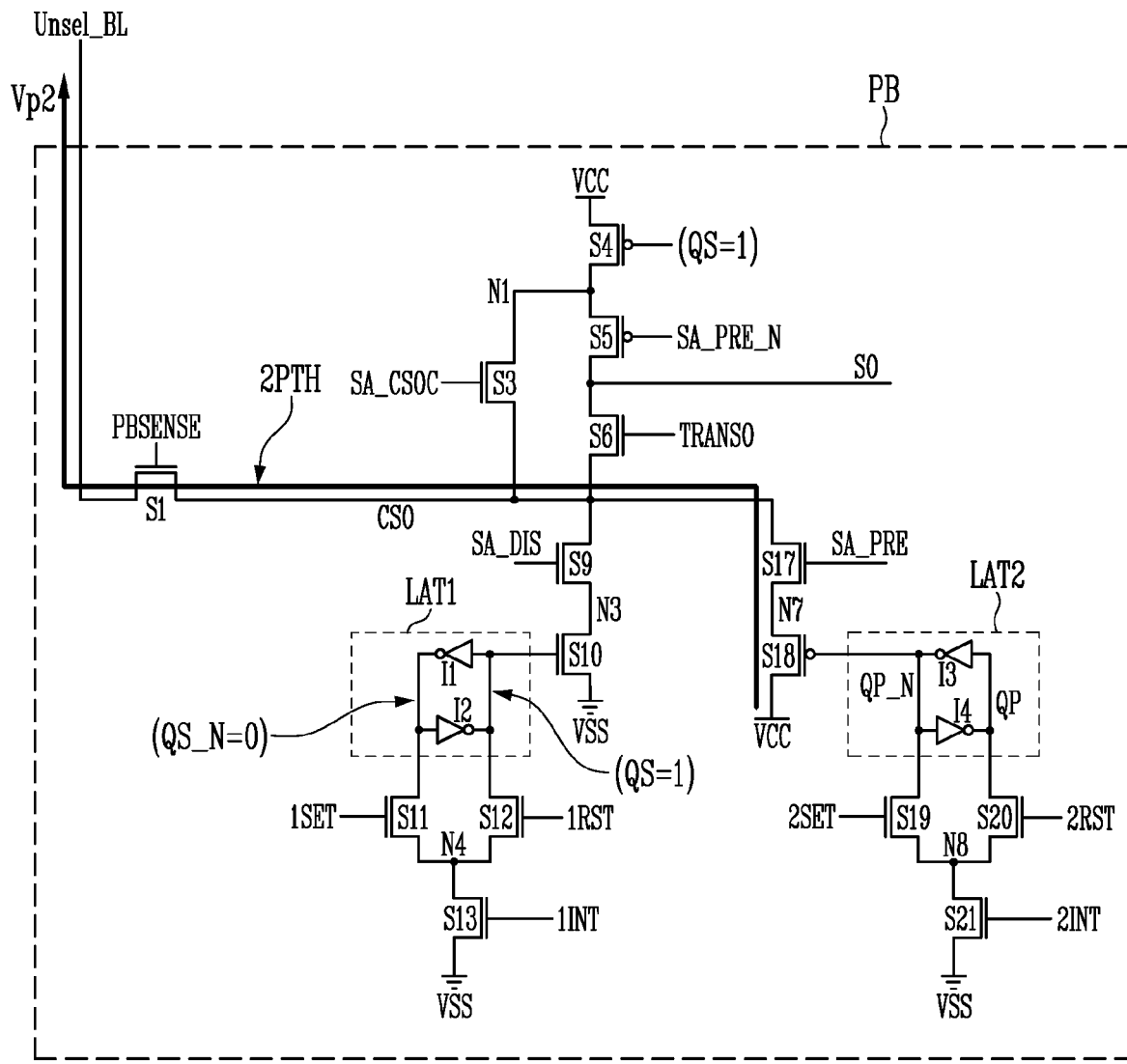

FIGS. 11A and 11B are diagrams illustrating the precharge operation using the page buffer according to the third embodiment. FIG. 11A is a diagram illustrating a precharge operation of the page buffer PB coupled to a selected bit line Sel_BL, and FIG. 11B is a diagram illustrating a precharge operation of the page buffer PB coupled to an unselected bit line Unsel_BL.

Referring to FIG. 11A, during a precharge operation, a page buffer sensing signal PBSENSE and a precharge signal SA_PRE, which have a high level, may be applied to the page buffer PB. In one embodiment, voltages of some signals may be set to different values. In one embodiment, the voltage level of the current sensing signal SA_CSOC may be set to a value lower than that of the transmission signal TRANSO, the voltage level of the page buffer sensing signal PBSENSE may be set to a value lower than that of the current sensing signal SA_CSOC, and the voltage level of the precharge signal SA_PRE may be set to a value lower than or equal to that of the page buffer sensing signal PBSENSE.

When data input to the data node QS is '0', the page buffer PB may output the first precharge voltage Vp1 through the first path 1PTH. Since the first path 1PTH through which the first precharge voltage Vp1 is output is identical to that of the first embodiment, a repeated description thereof will be omitted.

Referring to FIG. 11B, when data input to the data node QS is 1, data '1' may be input to the data replica node QP, and data '0' may be input to the inverting data replica node QP_N. Since data input to the inverting data replica node QP_N is '0', and the precharge signal SA_PRE has a high level, the eighteenth, seventeenth, and first switches S18, S17, and S1 may be turned on to form a second path 2PTH. Therefore, a second precharge voltage Vp2 may be generated from the supply voltage VCC supplied to the eighteenth switch S18 while passing through the second path 2PTH, and the second precharge voltage Vp2 may be applied to an unselected bit line Unsel_BL. That is, the page buffers, in which data '0' is input to the inverting data replica node QP_N of the second latch LAT2, may apply the second precharge voltage Vp2 to the bit lines.

In one embodiment, since the voltage level of the precharge signal SA_PRE for turning on the seventeenth switch S17 included in the second path 2PTH is set to a value lower than the voltage levels of signals for turning on the switches included in the first path (e.g., 1PTH of FIG. 11A), the turn-on level of the seventeenth switch S17 is lower than the turn-on level of the switches included in the first path 1PTH. Therefore, the second precharge voltage Vp2 lower than the first precharge voltage Vp1 may be applied to the current sensing node CSO, and the first switch S1 may be turned on, and thus the unselected bit line Unsel_BL may be precharged to the second precharge voltage Vp2. That is, the page buffers, in which data '1' is input to the data replica node QP of the second latch LAT2, may precharge the bit lines to the second precharge voltage Vp2 lower than the first precharge voltage (e.g., Vp1 of FIG. 11A). Since the second precharge voltage Vp2 output through the second path 2PTH is lower than the first precharge voltage Vp1, power consumption may be lower than that when all bit lines are precharged to the first precharge voltage Vp1.

Figure 12:
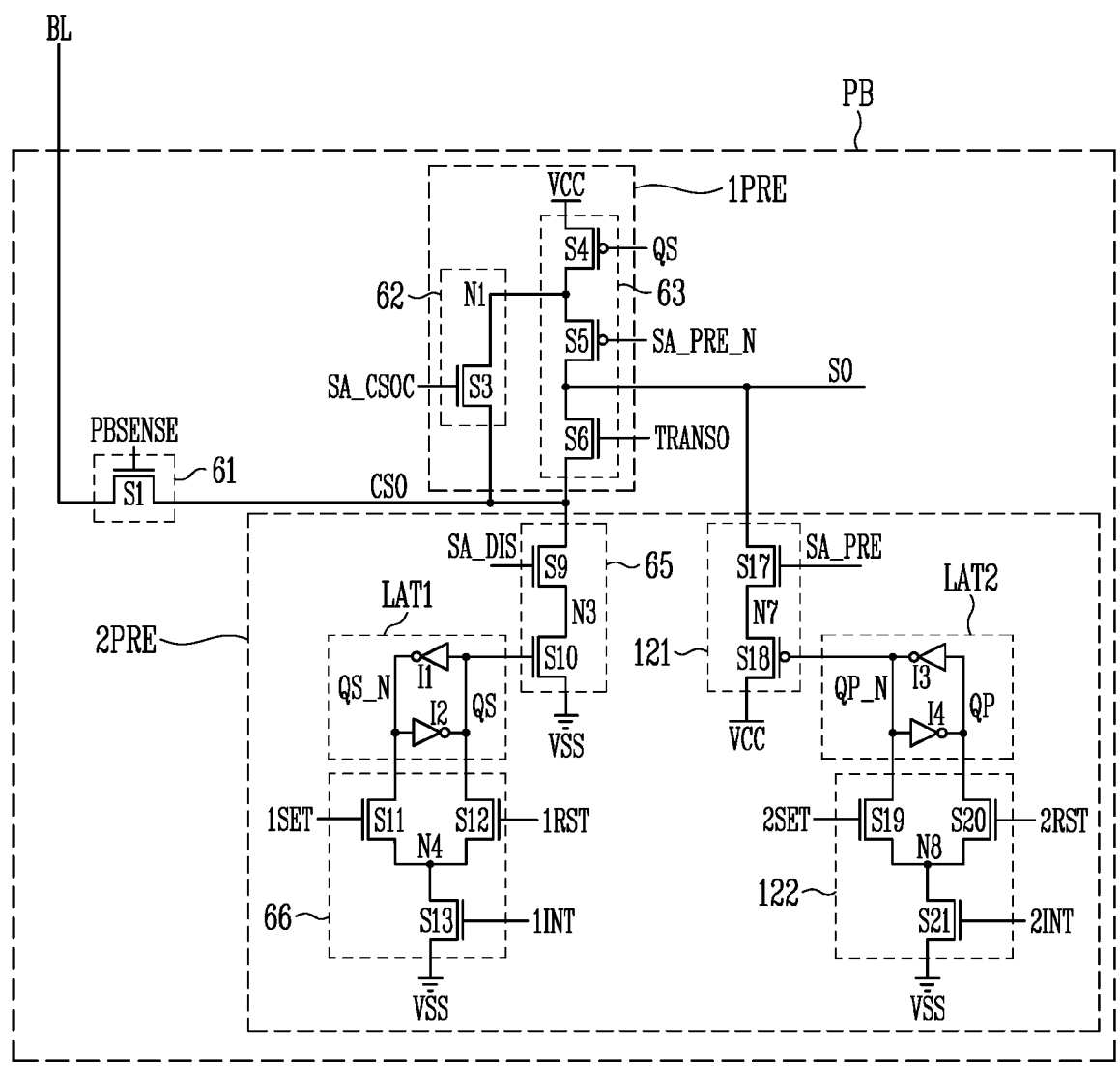
FIG. 12 is a circuit diagram illustrating a page buffer according to a fourth embodiment.

FIG. 12 is a circuit diagram illustrating a page buffer according to a fourth embodiment.

Referring to FIG. 12, some components of the page buffer PB according to the fourth embodiment are similar to those of the page buffer PB according to the third embodiment, and thus a repeated description of components overlapping the third embodiment will be omitted.

In the page buffer PB according to the fourth embodiment, a second sub-precharge circuit 121 may be coupled to a sensing node SO rather than a current sensing node CSO, and the coupling configuration of the remaining circuits may be identical to that of the third embodiment.

A precharge operation using the above-described page buffer PB according to the fourth embodiment will be described below.

Figure 13A:
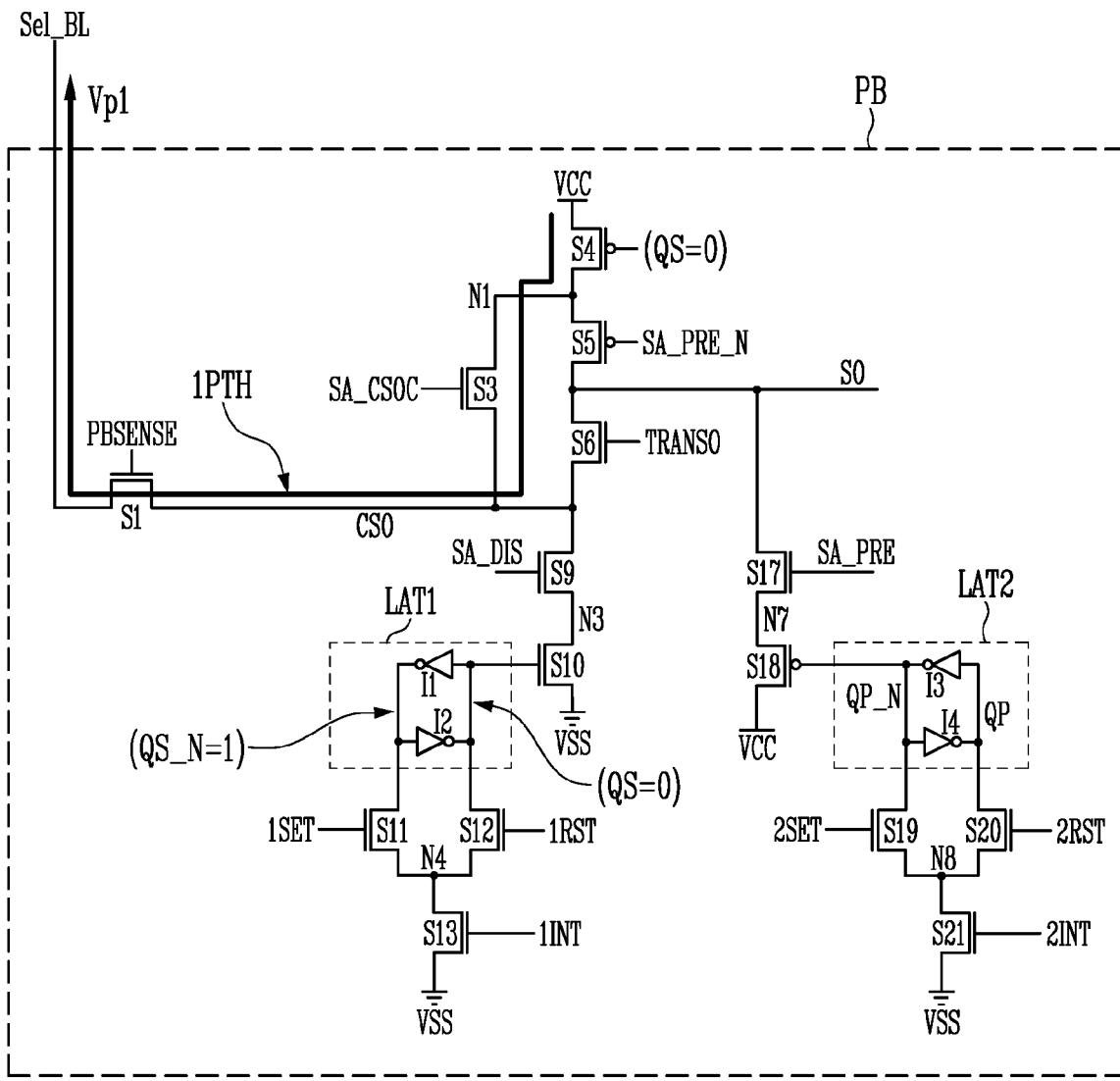
FIGS. 13A and 13B are diagrams illustrating a precharge operation using the page buffer according to the fourth embodiment.
Figure 13B:
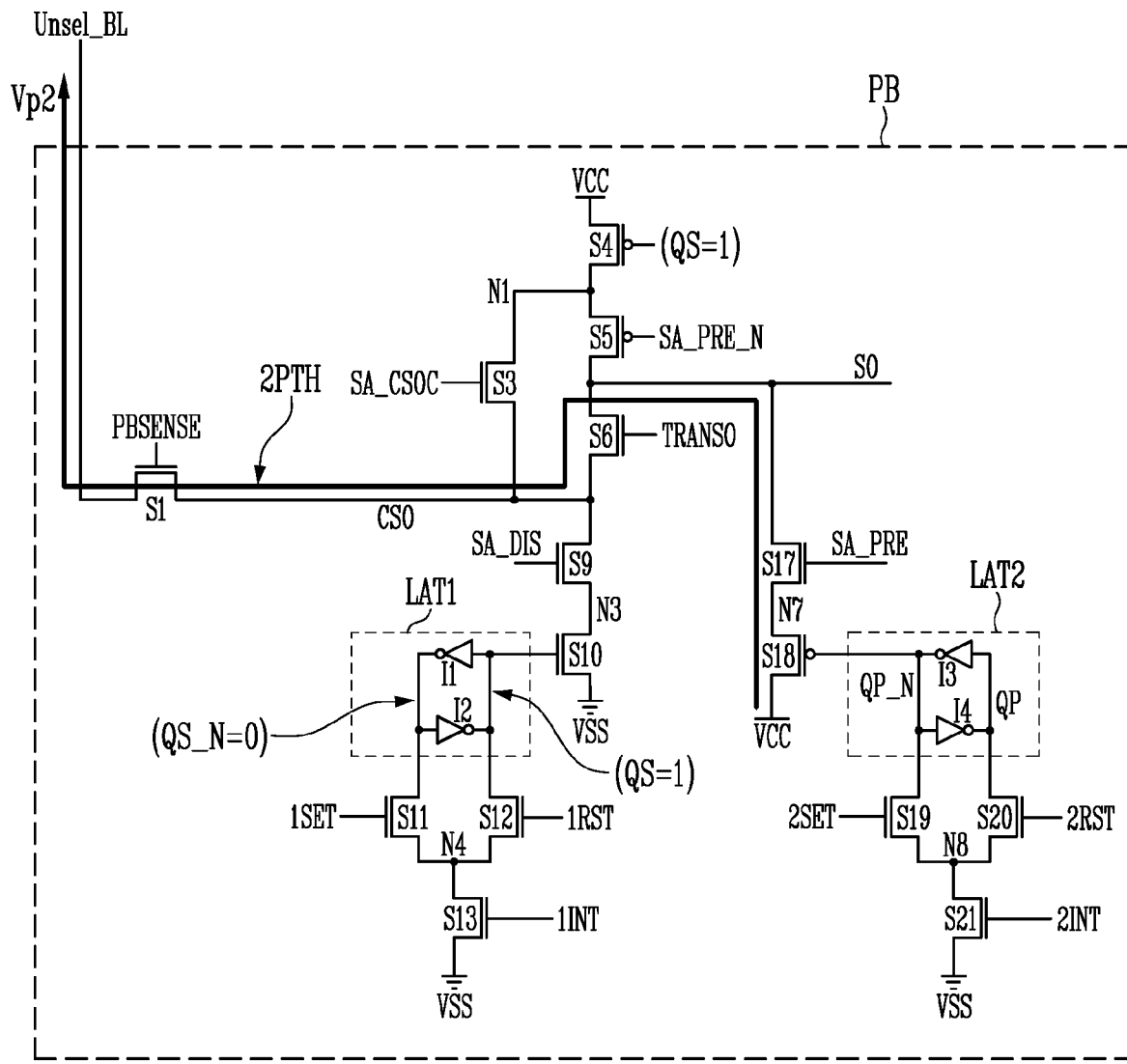

FIGS. 13A and 13B are diagrams illustrating the precharge operation using the page buffer according to the fourth embodiment. FIG. 13A is a diagram illustrating a precharge operation of the page buffer PB coupled to a selected bit line Sel_BL, and FIG. 13B is a diagram illustrating a precharge operation of the page buffer PB coupled to an unselected bit line Unsel_BL.

Referring to FIG. 13A, during a precharge operation, a page buffer sensing signal PBSENSE and a precharge signal SA_PRE, which have a high level, may be applied to the page buffer PB. In one embodiment, voltages of some signals may be set to different values. In one embodiment, the voltage level of the current sensing signal SA_CSOC may be set to a value lower than that of the transmission signal TRANSO, the voltage level of the page buffer sensing signal PBSENSE may be set to a value lower than that of the current sensing signal SA_CSOC, and the voltage level of the precharge signal SA_PRE may be set to a value lower than or equal to that of the page buffer sensing signal PBSENSE.

When data input to the data node QS is '0', the page buffer PB may output the first precharge voltage Vp1 through the first path 1PTH. Since the first path 1PTH through which the first precharge voltage Vp1 is output is identical to that of the first embodiment, a repeated description thereof will be omitted.

Referring to FIG. 13B, when data input to the data node QS is 1, data '1' may be input to the data replica node QP, and data '0' may be input to the inverting data replica node QP_N. Since data input to the inverting data replica node QP_N is '0', and the precharge signal SA_PRE has a high level, the eighteenth, seventeenth, sixth, and first switches S18, S17, S6, and S1 may be turned on to form a second path 2PTH. Therefore, a second precharge voltage Vp2 may be generated from the supply voltage VCC supplied to the eighteenth switch S18 while passing through the second path 2PTH, and the second precharge voltage Vp2 may be applied to an unselected bit line Unsel_BL. That is, the page buffers, in which data '0' is input to the inverting data replica node QP_N of the second latch LAT2, may apply the second precharge voltage Vp2 to the bit lines.

In one embodiment, since the voltage level of the precharge signal SA_PRE for turning on the seventeenth switch S17 included in the second path 2PTH is set to a value lower than the voltage levels of signals for turning on the switches included in the first path (e.g., 1PTH of FIG. 13A), the turn-on level of the seventeenth switch S17 is lower than the turn-on level of the switches included in the first path 1PTH. Therefore, the second precharge voltage Vp2 lower than the first precharge voltage Vp1 may be applied to the current sensing node CSO, and the first switch S1 may be turned on, and thus the unselected bit line Unsel_BL may be precharged to the second precharge voltage Vp2. That is, the page buffers, in which data '1' is input to the data replica node QP of the second latch LAT2, may precharge the bit lines to the second precharge voltage Vp2 lower than the first precharge voltage (e.g., Vp1 of FIG. 13A). Since the second precharge voltage Vp2 output through the second path 2PTH is lower than the first precharge voltage Vp1, power consumption may be lower than that when all bit lines are precharged to the first precharge voltage Vp1.

Figure 14:
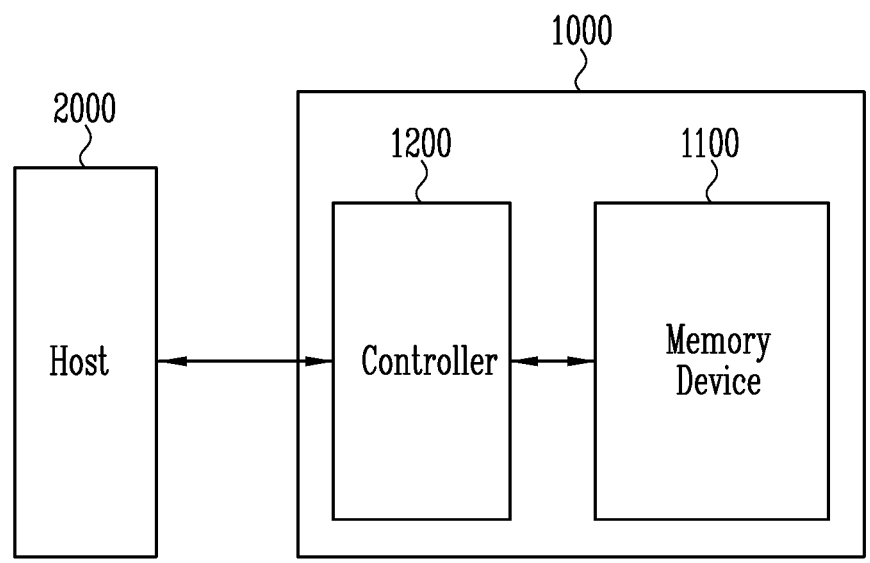
FIG. 14 is a diagram illustrating a memory system to which a memory device according to one embodiment is applied.

FIG. 14 is a diagram illustrating a memory system to which a memory device according to one embodiment is applied.

Referring to FIG. 14, a memory system 1000 may store, erase or output data in response to a request from a host 2000. For example, the memory system 1000 may include a memory device 1100 which can store data, and a controller 1200 which can perform communication between the host 2000 and the memory device 1100. Although the memory system 1000 including one memory device 1100 is illustrated in FIG. 14, the memory system 1000 may include two or more memory devices. The memory device 1100 illustrated in FIG. 14 may be the same as the memory device 1100 illustrated in FIG. 1.

When a request output from the host 2000 is received, the controller 1200 may generate a command for controlling the memory device 1100 in response to the request. The controller 1200 may manage logical addresses used by the host 2000 and physical addresses used by the memory device 1100. When a program operation is described as an example, the host 2000 may output a program request and data to the memory system 1000. The controller 1200 included in the memory system 1000 may generate a program command in response to a program request received from the host 2000, and may output the program command, a physical address and data to the memory device 1100.

Figure 15:
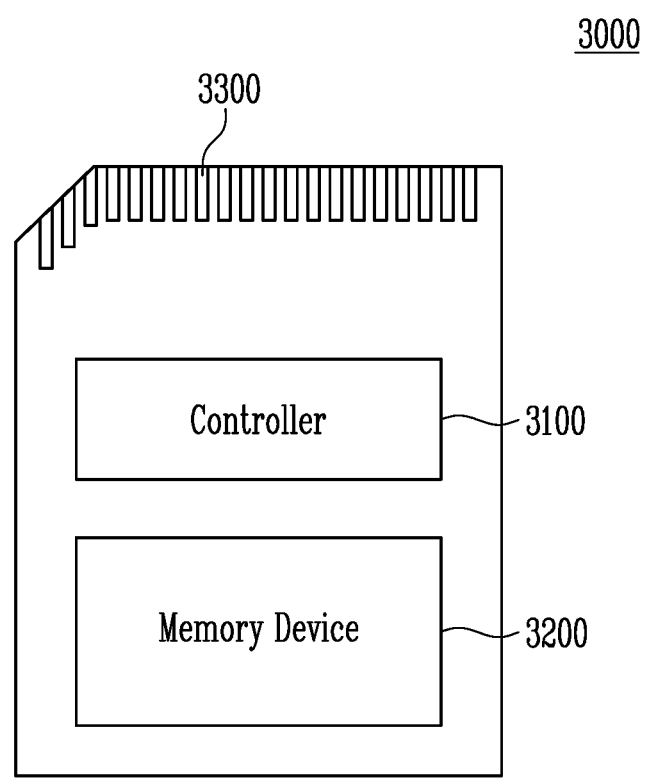
FIG. 15 is a diagram illustrating a memory card system to which a memory device according to one embodiment is applied.

FIG. 15 is a diagram illustrating a memory card system to which a memory device according to one embodiment is applied.

Referring to FIG. 15, a memory card system 3000 may include a controller 3100, a memory device 3200, and a connector 3300.

The controller 3100 is coupled to the memory device 3200. The controller 3100 may access the memory device 3200. In one embodiment, the controller 3100 may control a program, a read, or an erase operation of the memory device 3200, or may control a background operation of the memory device 3200. The controller 3100 may provide an interface between the memory device 3200 and a host (such as for example host 2000 shown in FIG. 14 or host 4100 shown in FIG. 16). The controller 3100 may run instructions (e.g., firmware) for controlling the memory device 3200. In one embodiment, the controller 3100 may include components, such as a random access memory (RAM), a processor, a host interface, a memory interface, and an error correction circuit.

The controller 3100 may communicate with an external device through the connector 3300. The controller 3100 may communicate with an external device (e.g., a host) based on a specific communication protocol. In one embodiment, the controller 3100 may communicate with the external device through at least one of various interface protocols such as universal serial bus (USB), multimedia card (MMC), embedded MMC (eMMC), peripheral component interconnection (PCI), PCI-express (PCI-E), an advanced technology attachment (ATA) protocol, a serial-ATA (SATA), parallel-ATA (PATA), small computer system interface (SCSI), enhanced small disk interface (ESDI), integrated drive electronics (IDE), firewire, universal flash storage (UFS), WIFI, Bluetooth, and nonvolatile memory express (NVMe) protocols. In one embodiment, the connector 3300 may be defined by at least one of the above-described various communication protocols.

The memory device 3200 may be configured in the same manner as the memory device 1100 illustrated in FIG. 1.

The controller 3100 and the memory device 3200 may be integrated into a single semiconductor device to form a memory card. In one embodiment, the controller 3100 and the memory device 3200 may be integrated into a single semiconductor device, and the controller 3100 and the memory device 3200 may then form a memory card such as a personal computer memory card international association (PCMCIA), a compact flash card (CF), a smart media card (SM or SMC), a memory stick, a multimedia card (MMC, RS-MMC, MMCmicro or eMMC), a SD card (SD, miniSD, microSD, or SDHC), or a universal flash storage (UFS).

Figure 16:
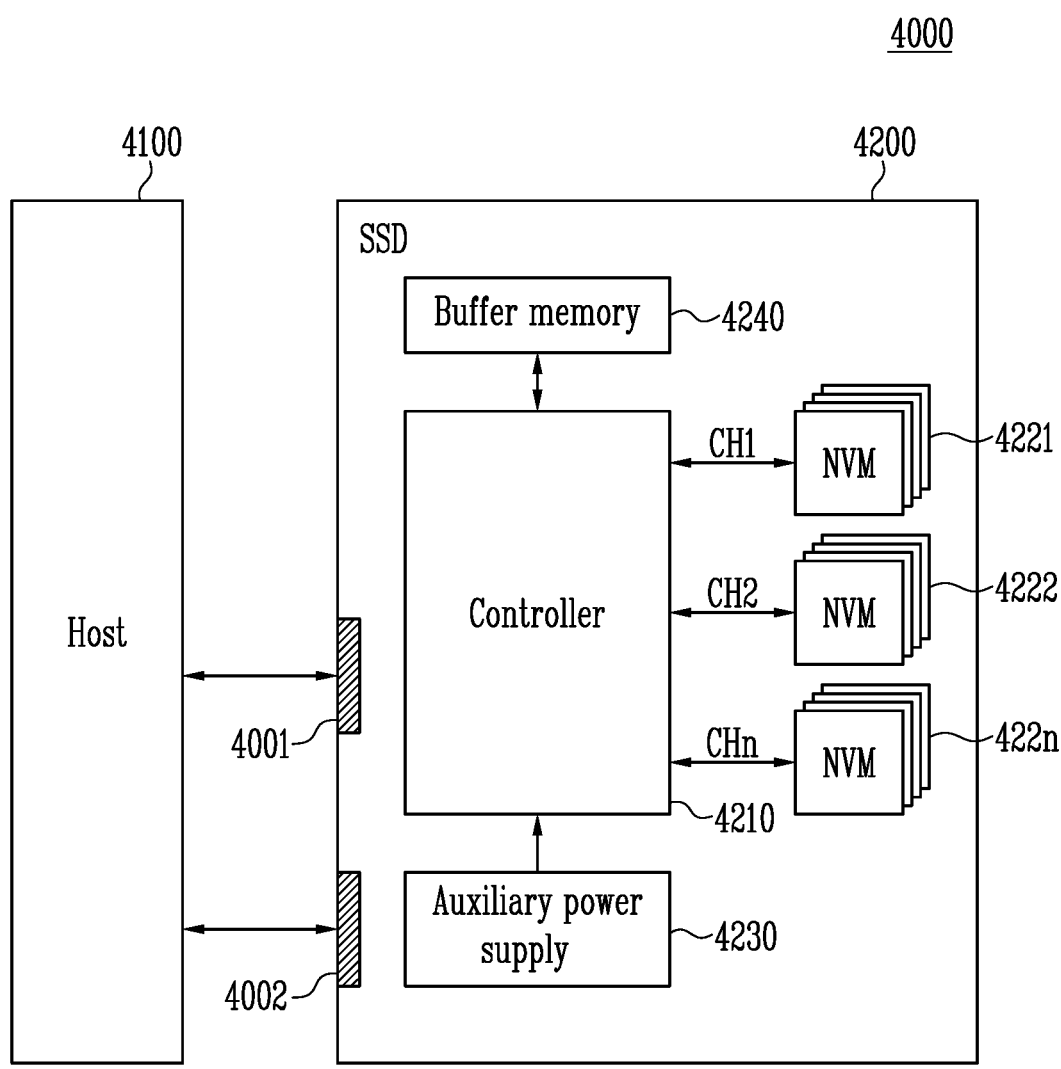
FIG. 16 is a diagram illustrating a solid state drive (SSD) system to which a memory device according to one embodiment is applied.

FIG. 16 is a diagram illustrating a solid state drive (SSD) system to which a memory device according to one embodiment applied.

Referring to FIG. 16, an SSD system 4000 may include a host 4100 and an SSD 4200. The SSD 4200 may exchange a signal SIG with the host 4100 through a signal connector 4001, and the SSD 4200 may receive power PWR through a power connector 4002. The SSD 4200 may include a controller 4210, a plurality of flash memories 4221 to 422n, an auxiliary power supply 4230, and a buffer memory 4240.

The controller 4210 may control the plurality of flash memories 4221 to 422n in response to signals received from the host 4100. In one embodiment, the signals may be signals based on the interfaces of the host 4100 and the SSD 4200. In one embodiment, such a signal may be a signal defined by at least one of various interfaces such as universal serial bus (USB), multimedia card (MMC), embedded MMC (eMMC), peripheral component interconnection (PCI), PCI-express (PCI-E), an advanced technology attachment (ATA), serial-ATA (SATA), parallel-ATA (PATA), small computer system interface (SCSI), enhanced small disk interface (ESDI), integrated drive electronics (IDE), firewire, universal flash storage (UFS), WiFi, Bluetooth, and nonvolatile memory express (NVMe) interfaces.

Each of the flash memories 4221 to 422n may be configured in the same manner as the memory device 1100 illustrated in FIG. 1.

The auxiliary power supply 4230 may be coupled to the host 4100 through the power connector 4002. The auxiliary power supply 4230 may be supplied with a supply voltage from the host 4100, and the auxiliary power supply 4230 may be charged with the supply voltage. The auxiliary power supply 4230 may provide the supply voltage of the SSD 4200 when the supply of power from the host 4100 is not smoothly performed. In one embodiment, the auxiliary power supply 4230 may be located inside the SSD 4200 or located outside the SSD 4200. In one embodiment, the auxiliary power supply 4230 may be located in a main board, and the auxiliary power supply 4230 may also provide auxiliary power to the SSD 4200.

The buffer memory 4240 may function as a buffer memory of the SSD 4200. In one embodiment, the buffer memory 4240 may temporarily store data received from the host 4100 or data received from the plurality of flash memories 4221 to 422n, or may temporarily store metadata (e.g., mapping tables) of the flash memories 4221 to 422n. The buffer memory 4240 may include volatile memories, such as a DRAM, an SDRAM, a DDR SDRAM, and an LPDDR SDRAM or nonvolatile memories, such as an FRAM, a ReRAM, an STT-MRAM, and a PRAM.

The memory systems and operations described herein may reduce current consumption when bit lines are precharged, and the memory systems may reduce variations in currents or voltages of the bit lines, thus improving the reliability of a verify operation performed on memory cells.

What is claimed is:

1. A memory device comprising:
a memory cell configured to store data; and
a page buffer configured to:
store data to be stored in the memory cell by a program operation, and
during a program verify operation, precharge a bit line to a first precharge voltage in response to the data stored in the page buffer being program data, or precharge the bit line to a second precharge voltage lower than the first precharge voltage in response to the data stored in the page buffer being erase data.

2. The memory device according to claim 1, wherein the page buffer comprises:
a first precharge circuit configured to generate the first precharge voltage;
a second precharge circuit configured to generate the second precharge voltage and including a first latch configured to store the data; and
a bit line coupling circuit configured to transmit the first or second precharge voltage to the bit line.

3. The memory device according to claim 2, wherein:
the first precharge circuit, the second precharge circuit, and the bit line coupling circuit are coupled in common to a current sensing node, and
the bit line coupling circuit is configured to transmit, to the bit line, the first or second precharge voltage applied to the current sensing node.

4. The memory device according to claim 3, wherein the first precharge circuit is supplied with a supply voltage and is configured to generate the first precharge voltage from the supply voltage through a first path.

5. The memory device according to claim 4, wherein the second precharge circuit is supplied with the supply voltage and is configured to generate the second precharge voltage from the supply voltage through a second path different from the first path.

6. The memory device according to claim 5, wherein:
when the data is program data, the first precharge circuit is activated, and
when the data is erase data, the second precharge circuit is activated.

7. The memory device according to claim 5, wherein:
the first precharge circuit includes first switches included in the first path, and
the second precharge circuit includes second switches included in the second path.

8. The memory device according to claim 7, wherein a voltage applied to a gate of at least one of the second switches has a level lower than a level of a voltage applied to gates of the first switches.

9. The memory device according to claim 7, wherein a turn-on level of at least one of the second switches has a level lower than a turn-on level of the first switches.

10. A memory device, comprising:
a memory cell configured to store data; and
a page buffer coupled to the memory cell through a bit line and configured to apply a first precharge voltage to the bit line in response to program data and to apply a second precharge voltage lower than the first precharge voltage to the bit line in response to erase data,
wherein the page buffer comprises:
a first precharge circuit configured to output the first precharge voltage to a current sensing node in response to the program data;
a second precharge circuit configured to output the second precharge voltage to the current sensing node in response to the erase data; and
a bit line coupling circuit configured to transmit, to the bit line, the first or second precharge voltage applied to the current sensing node.

11. The memory device according to claim 10, wherein:
the first precharge circuit is configured to be deactivated when the erase data is input to the page buffer, and
the second precharge circuit is configured to be deactivated when the program data is input to the page buffer.

12. The memory device according to claim 10, wherein the first precharge circuit comprises:
a first switch supplied with a supply voltage and configured to transmit the supply voltage to a first node in response to the program data; and
a second switch configured to transmit, to the current sensing node, the voltage applied to the first node.

13. The memory device according to claim 12, wherein the first switch is configured to be turned off in response to the erase data.

14. The memory device according to claim 10, wherein the second precharge circuit comprises:
a latch configured to store the program data or the erase data; and
a third switch supplied with a supply voltage and configured to decrease a level of the supply voltage to generate the second precharge voltage in response to inverted erase data that is inverted data of the erase data, and then output the second precharge voltage to the current sensing node.

15. The memory device according to claim 14, wherein a voltage level of a signal applied to a gate of the third switch is set to a level lower than a voltage level of signals applied to gates of switches included in the first precharge circuit.

16. The memory device according to claim 14, wherein:
when the memory cell is a program target cell, the program data is stored in the latch, and
when the memory cell is not a program target cell, the erase data is stored in the latch.

17. The memory device according to claim 14, wherein, when a threshold voltage of the memory cell increases up to a target voltage after the program data has been stored in the latch, the program data stored in the latch is changed to the erase data.

18. A memory device, comprising:
a memory cell configured to store data; and
a page buffer coupled to the memory cell through a bit line and configured to precharge the bit line in response to program data or erase data,
wherein the page buffer is configured to:
generate a first precharge voltage for precharging the bit line through a first path in response to the program data, and
generate a second precharge voltage for precharging the bit line through a second path in response to the erase data, and
wherein the second precharge voltage is lower than the first precharge voltage.

19. The memory device according to claim 18, wherein the first path is activated in response to the program data and is deactivated in response to the erase data.

20. The memory device according to claim 18, wherein the second path is activated in response to the erase data and is deactivated in response to the program data.

\* \* \* \* \*